United States Patent
Lai et al.

(10) Patent No.: US 9,086,455 B2
(45) Date of Patent: Jul. 21, 2015

(54) TESTING AND REPAIRING APPARATUS OF THROUGH SILICON VIA IN STACKED-CHIP

(75) Inventors: Hsin-Chi Lai, Taichung (TW); Chih-Sheng Lin, Tainan (TW); Pi-Feng Chiu, New Taipei (TW); Zhe-Hui Lin, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 754 days.

(21) Appl. No.: 13/326,331

(22) Filed: Dec. 15, 2011

(65) Prior Publication Data

US 2013/0093454 A1 Apr. 18, 2013

(30) Foreign Application Priority Data

Oct. 17, 2011 (TW) .............................. 100137526 A

(51) Int. Cl.

| | |
|---|---|
| *G01R 31/02* | (2006.01) |
| *G01R 31/3185* | (2006.01) |
| *G01R 31/28* | (2006.01) |
| *G01R 31/317* | (2006.01) |
| *H01L 21/66* | (2006.01) |

(52) U.S. Cl.
CPC .... *G01R 31/318513* (2013.01); *G01R 31/2812* (2013.01); *G01R 31/31717* (2013.01); *H01L 22/22* (2013.01)

(58) Field of Classification Search
CPC ..................... H01L 2225/06596; H01L 22/22; G01R 31/318513
USPC ................... 324/762.01, 762.02, 762.06, 750
See application file for complete search history.

(56) References Cited

U.S. PATENT DOCUMENTS

| | | | |
|---|---|---|---|
| 2010/0060310 A1* | 3/2010 | Laisne et al. ..................... 326/10 |
| 2010/0127758 A1 | 5/2010 | Hollis | |
| 2010/0200998 A1* | 8/2010 | Furuta et al. .................. 257/774 |
| 2010/0237891 A1 | 9/2010 | Lin et al. | |
| 2010/0295600 A1* | 11/2010 | Kim et al. ..................... 327/365 |
| 2011/0006391 A1 | 1/2011 | Lee et al. | |
| 2011/0050320 A1* | 3/2011 | Gillingham ................... 327/365 |

(Continued)

FOREIGN PATENT DOCUMENTS

TW        201025543 A1    7/2010

OTHER PUBLICATIONS

Taiwanese Office Action dated Mar. 17, 2014. 100137526.

(Continued)

*Primary Examiner* — Huy Q Phan
*Assistant Examiner* — Dustin Dickinson
(74) *Attorney, Agent, or Firm* — Birch, Stewart, Kolasch & Birch, LLP

(57) ABSTRACT

A testing and repairing apparatus of through silicon via (TSV) disposed between a first and a second chips is provided. First terminals of a first and a second switches are coupled to a first terminal of the TSV. First terminals of a third and a fourth switches are coupled to a second terminal of the TSV. A first terminal of a first resister is coupled to a first voltage. A first selector is coupled between second terminals of the second switch and the first resister. A second selector is coupled between a second terminal of the fourth switch and a second voltage. A first control circuit detects the second terminal of the second switch, and controls the first switch, the second switch and the first selector. A second control circuit controls the third switch, the fourth switch and the second selector.

28 Claims, 10 Drawing Sheets

(56) References Cited

U.S. PATENT DOCUMENTS

| | | |
|---|---|---|
| 2011/0057819 A1* | 3/2011 | Ide et al. .................. 341/100 |
| 2011/0084758 A1* | 4/2011 | Shibata et al. ............. 327/565 |
| 2011/0102011 A1* | 5/2011 | Van der Plas et al. ... 324/762.03 |
| 2012/0104388 A1* | 5/2012 | Choi et al. .................. 257/48 |
| 2012/0248438 A1* | 10/2012 | Lung et al. ................. 257/48 |

OTHER PUBLICATIONS

Kang et al., "8 Gb 3-D DDR3 DRAM Using Through-Silicon-Via Technology," IEEE Journal of Solid-State Circuits, vol. 45, No. 1, Jan. 1, 2010, pp. 111-119.

Cho et al., "Design method and test structure to characterize and repair TSV defect induced signal degradation in 3D system," Computer-Aided Design (ICCAD), 2010 IEEE/ACM International Conference, Nov. 7, 2010, pp. 694-697.

Contreras et al., "Micro networking: reliable communication on 3D integrated circuits," Electronics Letters, vol. 46, No. 4, Feb. 18, 2010, pp. 291-292.

Hsieh et al., "TSV redundancy Architecture and design issues in 3D IC," Design, Automation & Test in Europe Conference & Exhibition (DATE), 2010, Mar. 8, 2010, pp. 166-171.

* cited by examiner

TESTING AND REPAIRING APPARATUS OF THROUGH SILICON VIA IN STACKED-CHIP

CROSS-REFERENCE TO RELATED APPLICATION

This application claims the priority benefit of Taiwan application serial no. 100137526, filed on Oct. 17, 2011. The entirety of the above-mentioned patent application is hereby incorporated by reference herein and made a part of this specification.

BACKGROUND OF THE DISCLOSURE

1. Field of the Disclosure

The disclosure relates to a stacked-chip structure. Particularly, the disclosure relates to a testing and repairing apparatus of through silicon via in stacked-chip.

2. Description of Related Art

In recent years, the number of transistors in an integrated circuit (IC) is continuously increased, so that an IC usage area is accordingly increased. Regarding an overall operating time, increase of the IC area may aggravate problems of time delay and power consumption. In order to effectively mitigate the problems of time delay and power consumption, a three dimensional (3D) IC stacking technique is developed. In a 3D IC structure, multiple ICs are vertically stacked in a 3D space to achieve an optimal effect of reducing a structure size. Signals and a power voltage are transmitted between different ICs through a through silicon via (TSV) structure. Therefore, a connection length of different transistors and a delay time thereof are obviously shortened compared to a conventional planar circuit (2D), and meanwhile chip performance is improved and the power consumption is reduced.

A fabrication process of the 3D IC includes three parts: 1. formation of the TSV channel and filling of a conductive metal; 2. a wafer thinning process; and 3. chip stacking and combination. However, an insulation thin film (for example, $SiO_2$) used as a sidewall of the TSV is probably broken or invaded by external impurity during the fabrication process, which may easily cause an open circuit of the TSV or a situation that the TSV is shorted to the ground. Alternatively, after the TSV is fabricated, when multiple ICs are stacked, a tiny position offset may cause the open circuit of the TSV or the situation that the TSV is shorted to the ground. The open circuit of the TSV represents that the TSV cannot provide an effective path between different ICs to transmit signals. The situation that the TSV is shorted to the ground represents that the TSV is unexpectedly connected to the ground. Anyhow, the grounded TSV cannot transmit signals.

SUMMARY OF THE DISCLOSURE

The disclosure is directed to a testing and repairing apparatus of through silicon via (TSV) in stacked-chip, which is used for self-detecting whether the TSV is in good condition or not.

The disclosure provides a testing and repairing apparatus of through silicon via (TSV) in stacked-chip, which is adapted to test a TSV structure disposed in between a first chip and a second chip. The testing and repairing apparatus includes a first switch, a second switch, a first resistor, a first selector and a first control circuit which are disposed in the first chip, and a third switch, a fourth switch, a second selector and a second control circuit which are disposed in the second chip. First terminals of the first switch and the second switch are coupled to a first terminal of the TSV structure. A second terminal of the first switch is coupled to a function unit of the first chip. First terminals of the third switch and the fourth switch are coupled to a second terminal of the TSV structure. A second terminal of the third switch is coupled to a function unit of the second chip. A first terminal of the first resister is coupled to a first voltage. The first selector is coupled between a second terminal of the second switch and a second terminal of the first resister. The second selector is coupled between a second terminal of the fourth switch and a second voltage. The first control circuit detects the second terminal of the second switch, and controls the first switch, the second switch and the first selector. The second control circuit controls the third switch, the fourth switch and the second selector.

According to the above descriptions, during a test period, the first terminal of the TSV structure is coupled to the first voltage through the second switch, the first selector and the first resistor, and the second terminal of the TSV is coupled to the second voltage through the fourth switch and the second selector. If the TSV is normal, the first control circuit detects that a voltage at the second terminal of the second switch is close to the second voltage. If the TSV is failed, the first control circuit detects that the voltage at the second terminal of the second switch is close to the first voltage. Therefore, the testing and repairing apparatus in the stacked-chip is capable of self-detecting whether the TSV structure is good and repairing the failed TSV structure.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
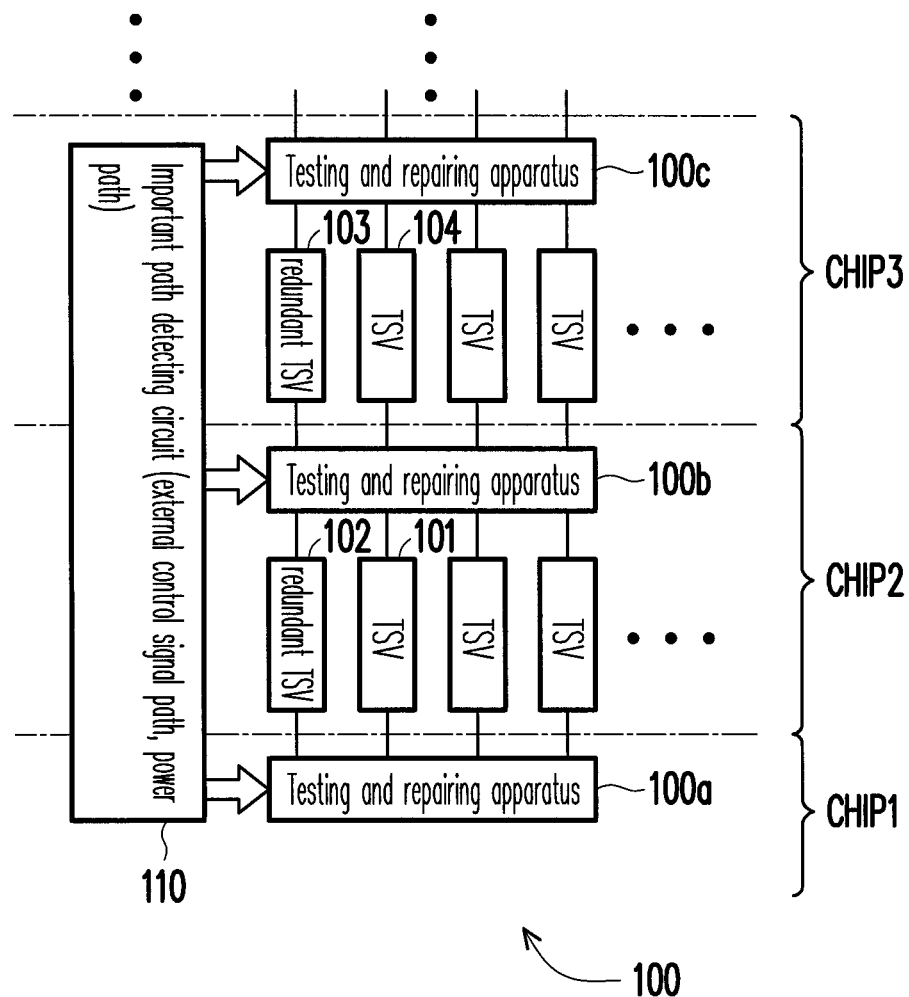
FIG. 1 is a schematic diagram of a testing and repairing apparatus of through silicon via (TSV) in stacked-chip according to an embodiment of the disclosure.

FIG. 1 is a schematic diagram of a testing and repairing apparatus 100 of through silicon via (TSV) in stacked-chip according to an embodiment of the disclosure. The stacked-chip is formed a plurality of chips stacked on each other, for example, chips CHIP1, CHIP2 and CHIP3 of FIG. 1 are stacked to each other to form the stacked-chip. Different TSV structures are used to transmit power and signals between different chips, for example, a function unit (not shown) of the chip CHIP1 can transmit signals (for example, a power voltage) to a function unit (not shown) of the chip CHIP2 through a TSV structure 101. Generally, the TSV structure includes pads, a TSV and micro bumps. The TSV structure is a known technique, so that details thereof are not introduced.

Referring to FIG. 1, the testing and repairing apparatus 100 of TSV includes a plurality of sub apparatuses disposed in different chips, for example, the testing and repairing apparatus 100 includes a testing and repairing apparatus 100a disposed in the chip CHIP1, a testing and repairing apparatus 100b disposed in the chip CHIP2, and a testing and repairing apparatus 100c disposed in the chip CHIP3. Based on external control signals, the testing and repairing apparatuses 100a, 100b and 100c respectively embedded in the chips can be used to test the TSV structures during a test period. For example, the testing and repairing apparatuses 100a and 100b can test the TSV structure 101 during the test period according to the external control signal. The test performed on the TSV structure 101 includes testing "whether the TSV is open-circuited" and/or "whether the TSV is short-circuited to the ground".

Moreover, the testing and repairing apparatus 100 is further configured with at least one redundant TSV structure, a redundant TSV structure 102 is disposed between the chips CHIP1 and CHIP2, and a redundant TSV structure 103 is disposed between the chips CHIP2 and CHIP3. When the testing and repairing apparatus 100a and/or the testing and repairing apparatus 100b perform testing to find that a certain TSV structure (for example, the TSV structure 101) is failed, the testing and repairing apparatus 100a and the testing and repairing apparatus 100b can switch a signal path to replace the failed TSV structure by the good redundant TSV structure 102. For another example, when the testing and repairing apparatus 100b and/or the testing and repairing apparatus 100c perform testing to find that a TSV structure 104 is failed, the testing and repairing apparatus 100b and the testing and repairing apparatus 100c can switch a signal path to replace the failed TSV structure 104 by a good redundant TSV structure 103. Therefore, the testing and repairing apparatus 100 has a function of self-repairing the TSVs.

Figure 2:
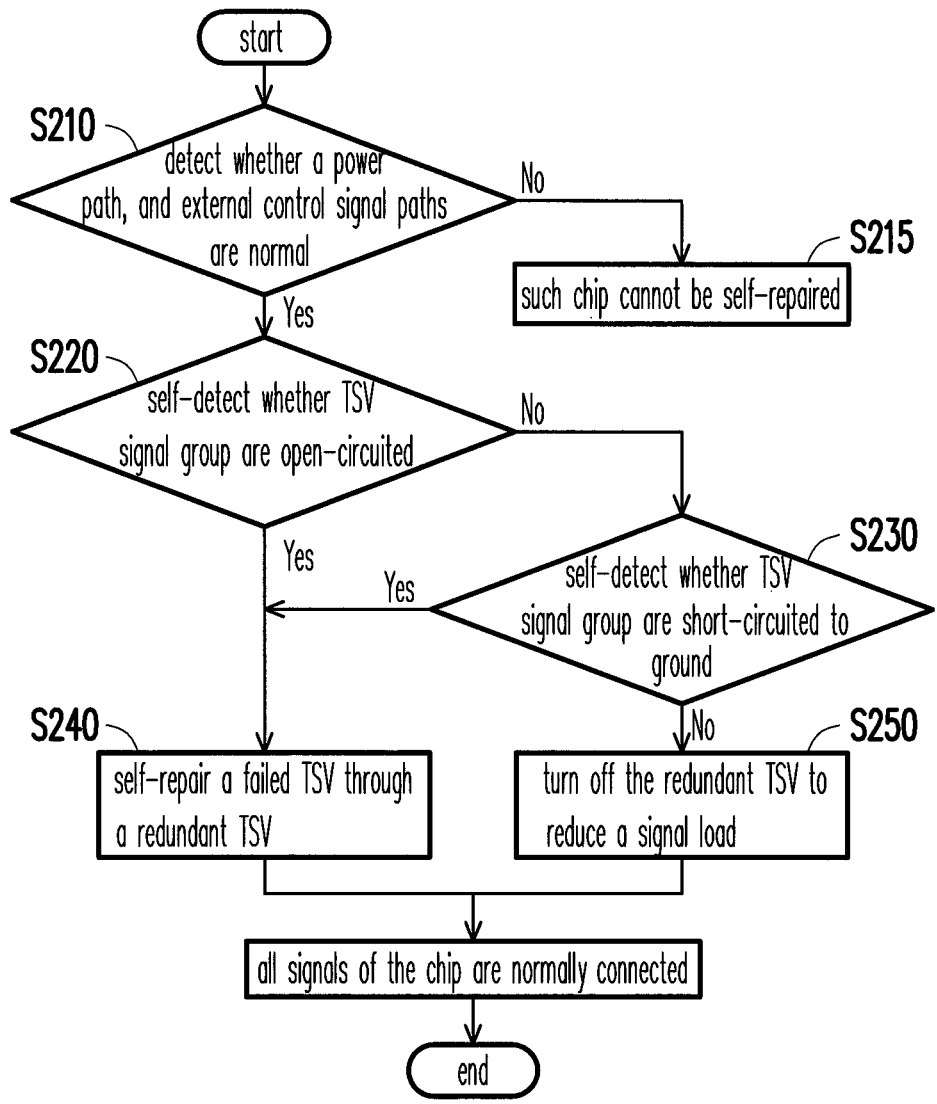
FIG. 2 is a flowchart illustrating a testing flow of the testing and repairing apparatus of FIG. 1 according to an embodiment of the disclosure.

FIG. 2 is a flowchart illustrating a testing flow of the testing and repairing apparatus 100 of FIG. 1 according to an embodiment of the disclosure. Before the TSV structures in the stacked-chip are tested and/or repaired, an important path detecting circuit 110 executes a step S210 to detect whether a transmission path of the external control signals and a transmission path of a power voltage are normal.

Figure 3:
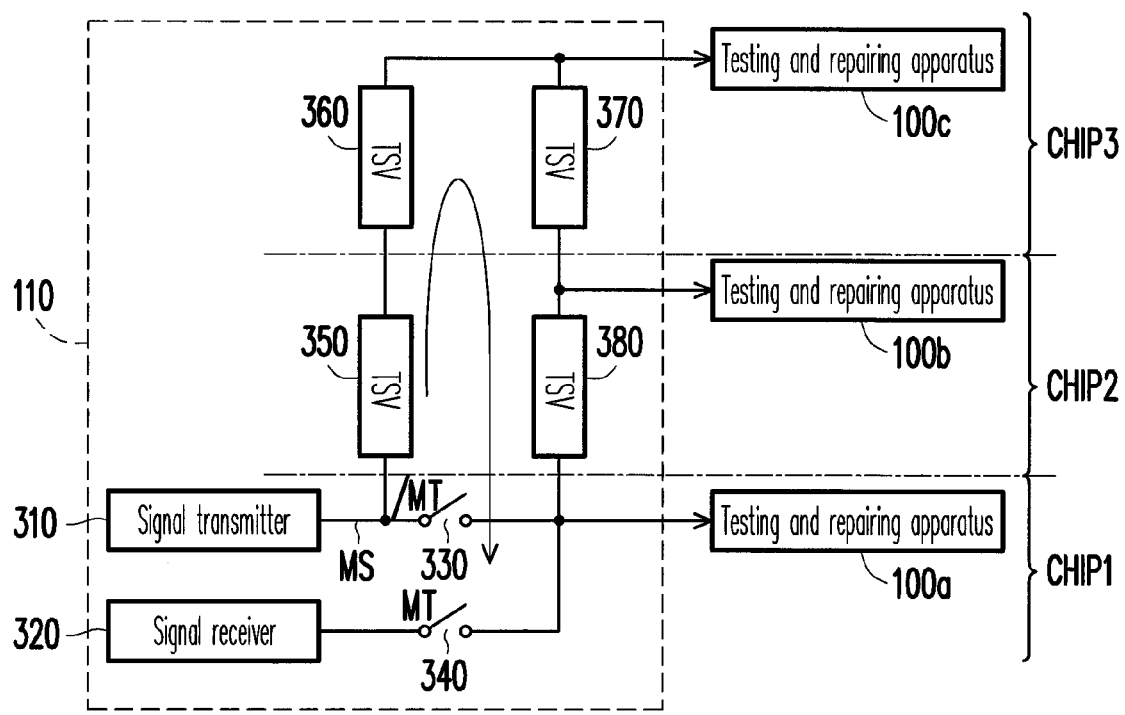
FIG. 3 is a block schematic diagram of an important path detecting circuit of FIG. 1 used for detecting external controls signal according to an embodiment of the disclosure.

FIG. 3 is a block schematic diagram of the important path detecting circuit 110 of FIG. 1 used for detecting the external control signals according to an embodiment of the disclosure. In the present embodiment, a transmission path of a mode selection signal MS in the external control signals is taken as an example for description, and transmission path detecting circuits of the other external control signals can be deduced according to the embodiment of FIG. 3. The transmission path detecting circuit of the power voltage (for example, a power voltage VDD, a ground voltage GND, etc.) can also be deduced according to instructions of the embodiment of FIG. 3. Moreover, in the embodiment of FIG. 3, the stacked-chip is a 3-layer stack, i.e., the stacked-chip is formed by the three chips CHIP1-CHIP3 stacked to each other. The important path detecting circuit 110 of a 2-layer stack, a 4-layer stack or other numbers of layers stack can be deduced according to instructions of the embodiment of FIG. 3.

Referring to FIG. 3, the important path detecting circuit 110 includes a signal transmitter 310, a signal receiver 320, a first path detecting switch 330, a second path detecting switch 340, a first path detecting TSV structure 350, a second path detecting TSV structure 360, a third path detecting TSV structure 370 and a fourth path detecting TSV structure 380. A first terminal of the switch 330 and a first terminal of the TSV structure 350 are coupled to an output terminal of the signal transmitter 310. A first terminal of the TSV structure 360 is coupled to a second terminal of the TSV structure 350, and a second terminal of the TSV structure 360 is coupled to the testing and repairing apparatus 100c of the chip CHIP3. A first terminal of the TSV structure 370 is coupled to the second terminal of the TSV structure 360, and a second terminal of the TSV structure 370 is coupled to the testing and repairing apparatus 100b of the chip CHIP2. A first terminal of the TSV structure 380 is coupled to the second terminal of the TSV structure 370, and a second terminal of the TSV structure 380 is coupled to the testing and repairing apparatus 100a of the chip CHIP1, a second terminal of the switch 330 and a first terminal of the switch 340. A second terminal of the switch 340 is coupled to an input terminal of the signal receiver 320.

The switch 340 is controlled by a main test signal MT, and the switch 330 is controlled by an inverted test signal /MT, where the inverted test signal /MT is an inverted signal of the main test signal MT. When the important path detecting circuit 110 executes the step S210, the switch 330 is turned off and the switch 340 is turned on. If the transmission path of the mode selection signal MS is good, the mode selection signal MS output by the signal transmitter 310 can be transmitted to the signal receiver 320 through the TSV structure 350, the TSV structure 360, the TSV structure 370, the TSV structure 380 and the switch 340. If any one of the TSV structures 350, 360, 370 and 380 is failed, the signal receiver 320 cannot receive the mode selection signal MS output by the signal transmitter 310 in the step S210, which represents that the transmission path of the mode selection signal MS is failed. Therefore, once the signal receiver 320 cannot receive the mode selection signal MS output by the signal transmitter 310 in the step S210, the important path detecting circuit 110 determines that the stacked-chip cannot be self-detected/repaired (step S215). If the transmission path of the external control signal or the power voltage is damaged, the stacked-chip is determined to be completely failed, and subsequent detection and repair are unnecessary to be performed, so as to improve measure efficiency.

Comparatively, if the signal receiver 320 can receive the mode selection signal MS output by the signal transmitter 310 in the step S210, the important path detecting circuit 110 determines that the transmission path of the mode selection signal MS is good. Similarly, the important path detecting circuit 110 can determine whether the transmission paths of the other external control signals (for example, a top power switch signal PST and a bottom power switch signal PSB, etc.) are good in the step S210. Deduced by analogy, the important path detecting circuit 110 can also determine whether the transmission path of the power voltage (for example, the power voltage VDD and the ground voltage GND, etc.) is good in the step S210. If the important path detecting circuit 110 determines that the transmission path of the other external control signal is failed, or determines that the transmission path of the power voltage is failed in the step S210, the important path detecting circuit 110 determines that the stacked-chip cannot be self-detected/repaired (step S215).

Referring to FIG. 2, if the important path detecting circuit 110 determines that all of the transmission paths of the external control signals are good and the transmission path of the power voltage is good in the step S210, the testing and repairing apparatus 100 executes a step S220 after the step S210. In the step S220, the testing and repairing apparatus 100 tests whether each of the TSV structures (for example, the TSV structure 101) in FIG. 1 is open-circuited. If a determination result of the step S220 is negative, the testing and repairing apparatus 100 executes a step S230. If the determination result of the step S220 is affirmative, the testing and repairing apparatus 100 executes a step S240. Namely, if the testing and repairing apparatus 100 tests that any of the TSV structures is damaged, it automatically grabs the redundant TSV structure without executing the step S230, so as to improve a testing efficiency. The redundant TSV structure is used to repair the damaged TSV path.

In the step S230, the testing and repairing apparatus 100 tests whether each of the TSV structures (for example, the TSV structure 101) in FIG. 1 has a leakage path to the substrate. If a determination result of the step S230 is affirmative, the testing and repairing apparatus 100 executes the step S240, or otherwise executes a step S250. It should be noticed that in the present embodiment, it is first tested whether the TSV structures are open-circuited, and then whether the TSV structures have a leakage path to the substrate are tested. In other embodiments, the testing and repairing apparatus 100 probably first tests whether the TSV structures are have a leakage path to the substrate in the step S220, and then tests whether the TSV structures are open-circuited in the step S230.

For example, if it is determined that the TSV structure 101 is open-circuited in the step S220, or it is determined that the TSV structure 101 has a leakage path to the substrate in the step S230, it represents that the TSV structure 101 is failed, so that the testing and repairing apparatus 100 executes the step S240 to replace the failed TSV structure by the good redundant TSV structure 102. Replacement of the other failed TSV structures can be deduced by analogy. Therefore, the testing and repairing apparatus 100 has the function of self-repairing the TSVs, so as to guarantee normal signal transmission of the signal paths between different chips.

If the testing and repairing apparatus 100 determines that all of the TSV structures pass through the tests of the steps S220 and S230, it represents that all of the TSV structures are good, so that the testing and repairing apparatus 100 perform the step S250 to automatically turn off the redundant TSV structures to avoid reduction of a signal load due to load capacitance of a metal signal line.

Therefore, the embodiment discloses a TSV self-testing and repairing mechanism used for three-dimensional (3D) integrated circuits (ICs). By using the testing method and structure shown in FIG. 1 and FIG. 2, it is first tested whether the transmission paths of the main control signals and the transmission path of the power voltage are normal, and then each signal line containing the TSV in the circuit is self-tested to determine whether the TSV is open-circuited or has a leakage path to the substrate. In the present embodiment, the failed TSV can be self-repaired, i.e. the redundant TSV can be used to replace the failed TSV, so as to guarantee a normal operation of the whole stacked-chip and improve a yield of the whole circuit.

Figure 4:
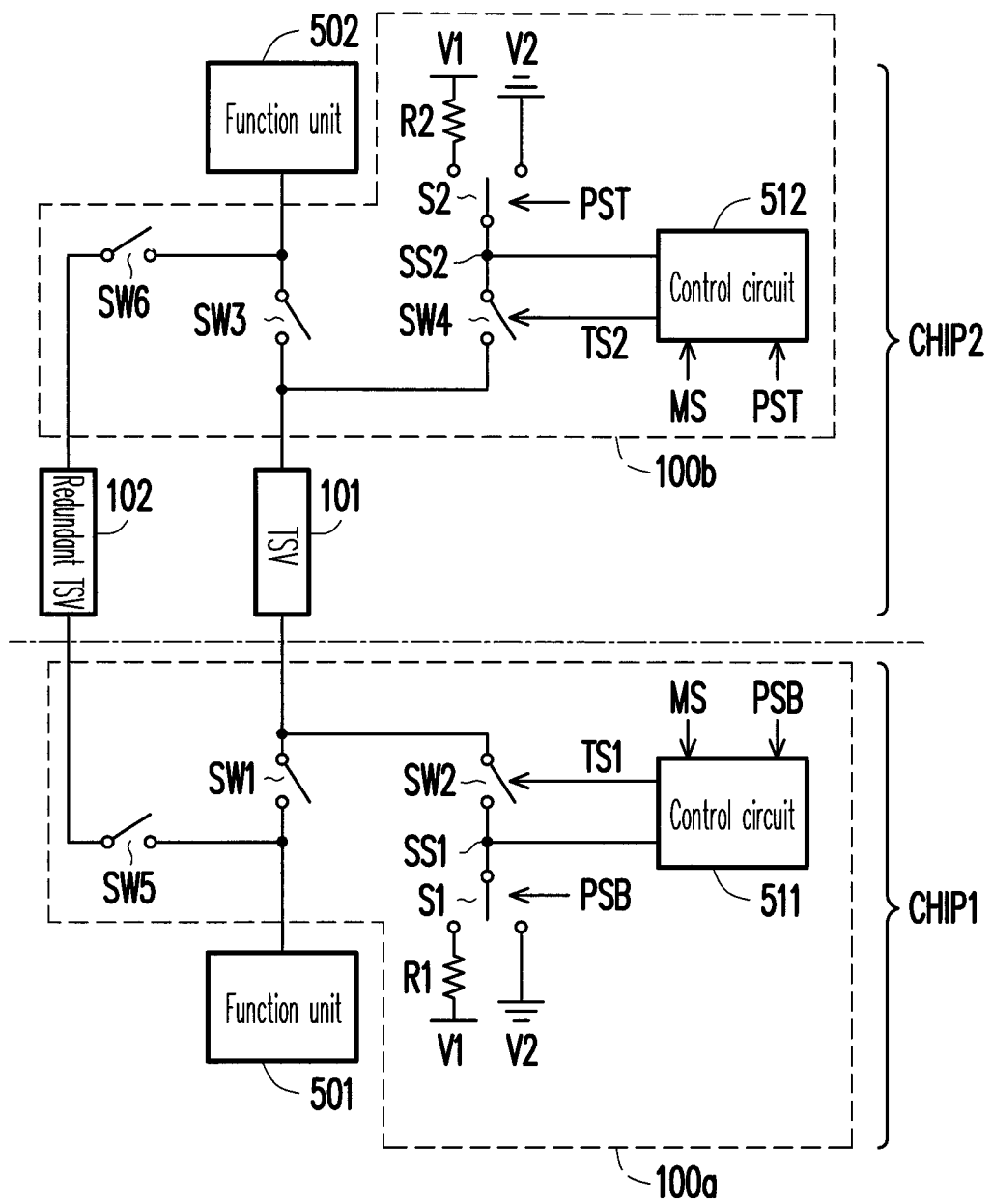
FIG. 4 is a circuit schematic diagram of the testing and repairing apparatus of FIG. 1 according to an embodiment of the disclosure.

FIG. 4 is a circuit schematic diagram of the testing and repairing apparatus 100 of FIG. 1 according to an embodiment of the disclosure. The testing and repairing apparatus 100 has sub testing and repairing apparatuses 100a and 100b for testing the TSV structure 101 disposed between the chip CHIP1 and the chip CHIP2 in the stacked-chip. The testing and repairing apparatus 100 includes a first switch SW1, a second switch SW2, a third switch SW3, a fourth switch SW4, a first resistor R1, a first selector S1, a second selector S2, a first control circuit 511 and a second control circuit 512. The first switch SW1, the second switch SW2, the first resistor R1, the first selector S1 and the first control circuit 511 are disposed in the chip CHIP1, and the third switch SW3, the fourth switch SW4, the second selector S2 and the second control circuit 512 are disposed in the second chip CHIP2.

First terminals of the first switch SW1 and the second switch SW2 are coupled to a first terminal of the TSV structure 101. A second terminal of the first switch SW1 is coupled to a function unit 501 of the chip CHIP1. The function unit 501 can be a pad, an active circuit or other devices of the chip CHIP1. A first terminal of the first resistor R1 is coupled to a first voltage V1 (for example, the power voltage VDD or the other referential voltages). The first selector S1 is coupled between a second terminal of the second switch SW2 and a second terminal of the first resistor R1. The first control circuit 511 controls the first switch SW1, the second switch SW2 and the first selector S1, and the first control circuit 511 detects the second terminal of the second switch SW2.

First terminals of the third switch SW3 and the fourth switch SW4 are coupled to a second terminal of the TSV structure 101. A second terminal of the third switch SW3 is coupled to a function unit 502 of the chip CHIP2. The function unit 502 can be a pad, an active circuit or other devices of the chip CHIP2. The second selector S2 is coupled between a second terminal of the fourth switch SW4 and a second voltage V2, where the second voltage V2 can be a ground voltage or other reference voltages. The second control circuit 512 controls the third switch SW3, the fourth switch SW4 and the second selector S2.

For example, during a first test period, the first control circuit 511 turns off the first switch SW1, turns on the second switch SW2 and controls the first selector S1 to couple the second terminal of the second switch SW2 to the second terminal of the first resistor R1. Moreover, during the first test period, the second control circuit 512 turns off the third switch SW3, turns on the fourth switch SW4 and controls the second selector S2 to couple the second terminal of the fourth switch SW4 to the second voltage V2. When the TSV structure 101 is open-circuited, the second voltage V2 of the second selector S2 cannot be transmitted to the second switch SW2, so that a voltage SS1 at the second terminal of the second switch SW2 is pulled up to be close to the first voltage V1 by the first resistor R1. Once the first control circuit 511 detects that the voltage SS1 at the second terminal of the second switch SW2 is the first voltage V1 (or is close to the first voltage V1) during the first test period, it represents that the TSV structure 101 is open-circuited. Comparatively, when the TSV structure 101 is effective (good), the second voltage V2 of the second selector S2 pulls down the voltage SS1 at the second terminal of the second switch SW2 to be close to the second voltage V2 through the TSV structure 101. Once the first control circuit 511 detects that the voltage SS1 at the second terminal of the second switch SW2 is the second voltage V2 (or is close to the second voltage V2) during the first test period, it represents that the TSV structure 101 is effective (good).

Therefore, the testing and repairing apparatus 100 embedded in the stacked-chip can self-test whether the TSV structure 101 is conducted during the first test period. After the first control circuit 511 determines that the TSV structure 101 is effective (good) during the first test period, the first control circuit 511 turns on the first switch SW1 and turns off the second switch SW2 during a normal operation period.

In another embodiment, the testing and repairing apparatus 100 further includes a second resistor R2 in the chip CHIP2. A first terminal of the second resistor R2 is coupled to the first voltage V1 (for example, the power voltage VDD or the other reference voltages). A second terminal of the second resistor R2 is coupled to the second selector S2. The first selector S1 is further coupled to the second voltage V2. For example, during a second test period, the first control circuit 511 turns off the first switch SW1, turns on the second switch SW2 and controls the first selector S1 to couple the second terminal of the second switch SW2 to the second voltage V2. Moreover, the second control circuit 512 turns off the third switch SW3, turns on the fourth switch SW4 and controls the second selector S2 to couple the second terminal of the fourth switch SW4 to the second terminal of the second resistor R2. Moreover, the second control circuit 512 detects the second terminal of the fourth switch SW4 during the second test period.

When the TSV structure 101 is open-circuited, the second voltage V2 of the first selector S1 cannot be transmitted to the fourth switch SW4, so that a voltage SS2 at the second terminal of the fourth switch SW4 is pulled up to be close to the first voltage V1 by the second resistor R2. Once the second control circuit 512 detects that the voltage SS2 at the second terminal of the fourth switch SW4 is the first voltage V1 (or is close to the first voltage V1) during the first test period, it represents that the TSV structure 101 is open-circuited. Comparatively, when the TSV structure 101 is effective (good), the second voltage V2 of the first selector S1 pulls down the voltage SS2 at the second terminal of the fourth switch SW4 to be close to the second voltage V2 through the TSV structure 101. Once the second control circuit 512 detects that the voltage SS2 at the second terminal of the fourth switch SW4 is the second voltage V2 (or is close to the second voltage V2) during the first test period, it represents that the TSV structure 101 is effective (good).

Therefore, the testing and repairing apparatus 100 embedded in the stacked-chip can self-test whether the TSV structure 101 is conducted during the second test period. After the second control circuit 512 determines that the TSV structure 101 is effective (good) during the second test period, the second control circuit 512 turns on the third switch SW3 and turns off the fourth switch SW4 during the normal operation period.

Figure 5:
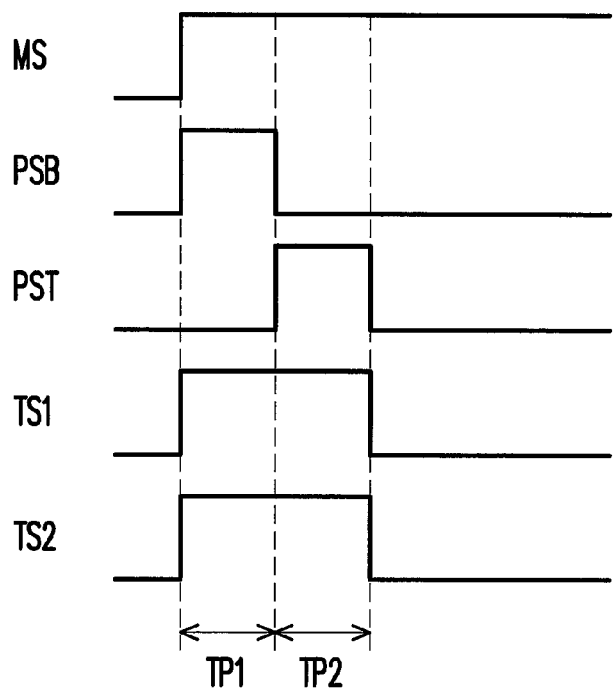
FIG. 5 is a timing schematic diagram of control signals in FIG. 4 according to an embodiment of the disclosure.

FIG. 5 is a timing schematic diagram of control signals in FIG. 4 according to an embodiment of the disclosure. The mode selection signal MS, the top power switch signal PST and the bottom power switch signal PSB shown in FIG. 5 are external control signals. The first control circuit 511 outputs a first test signal TS1 to control the second switch SW2 according to the mode selection signal MS and the bottom power switch signal PSB. The second control circuit 512 outputs a second test signal TS2 to control the fourth switch SW4 according to the mode selection signal MS and the top power switch signal PST.

Referring to FIG. 4 and FIG. 5, during the first test period TP1 and the second test period TP2, the mode selection signal MS has a high logic level, which represents an open circuit testing mode. In the first test period TP1, the bottom power switch signal PSB has the high logic level, and the top power switch signal PST has a low logic level, so that the first control circuit 511 turns off the first switch SW1, turns on the second switch SW2 and controls the first selector S1 to couple the second terminal of the second switch SW2 to the second terminal of the first resistor R1. Moreover, during the first test period TP1, the second control circuit 512 turns off the third switch SW3, turns on the fourth switch SW4 and controls the second selector S2 to couple the second terminal of the fourth switch SW4 to the second voltage V2. In the second test period TP2, the top power switch signal PST has the high logic level, and the bottom power switch signal PSB has the low logic level, so that the first control circuit 511 turns off the first switch SW1, turns on the second switch SW2 and controls the first selector S1 to couple the second terminal of the second switch SW2 to the second voltage V2. Moreover, in the second test period TP2, the second control circuit 512 turns off the third switch SW3, turns on the fourth switch SW4 and controls the second selector S2 to couple the second terminal of the fourth switch SW4 to the second terminal of the second resistor R2.

Figure 6:
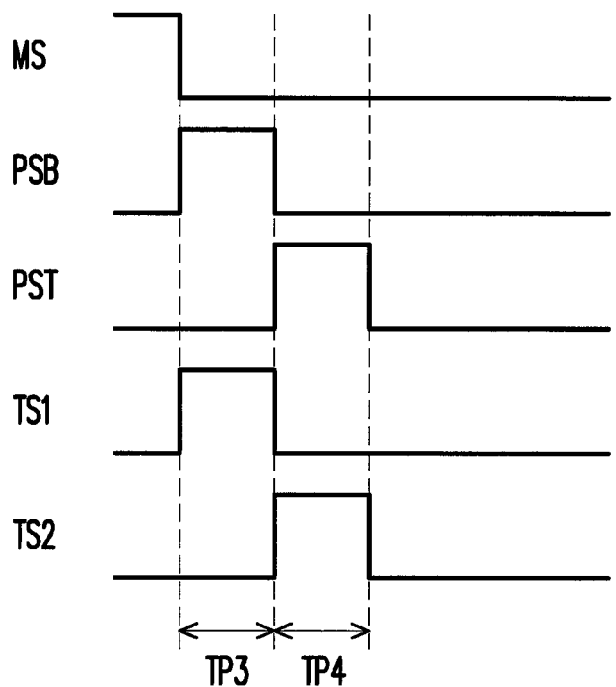
FIG. 6 is a timing schematic diagram of control signals in FIG. 4 according to another embodiment of the disclosure.

FIG. 6 is a timing schematic diagram of control signals in FIG. 4 according to another embodiment of the disclosure. Referring to FIG. 4 and FIG. 6, during a third test period TP3 and a fourth test period TP4, the mode selection signal MS has the low logic level, which represents a short circuit testing mode. In the third test period TP3, the bottom power switch signal PSB has the high logic level, and the top power switch signal PST has the low logic level, so that the first control circuit 511 turns off the first switch SW1, turns on the second switch SW2 and controls the first selector S1 to couple the second terminal of the second switch SW2 to the second terminal of the first resistor R1. Moreover, during the third test period, the second control circuit 512 turns off the third switch SW3 and the fourth switch SW4. When the TSV structure 101 has a leakage path to the substrate, the substrate voltage of the TSV structure 101 pulls down the voltage SS1 at the second terminal of the second switch SW2 to be close to the substrate voltage (e.g., ground voltage). Once the first control circuit 511 detects that the voltage SS1 at the second terminal of the second switch SW2 is the ground voltage (or is close to the ground voltage) during the third test period TP3, it represents that the TSV structure 101 has a leakage path to the substrate.

Comparatively, when the TSV structure 101 is effective (good), the voltage SS1 at the second terminal of the second switch SW2 is pulled up to be close to the first voltage V1 by the first resistor R1. Once the first control circuit 511 detects that the voltage SS1 at the second terminal of the second switch SW2 is the first voltage V1 (or is close to the first voltage V1) during the third test period TP3, it represents that the TSV structure 101 is effective (good). After the first control circuit 511 determines that the TSV structure 101 is effective (good) during the third test period TP3, the first control circuit 511 turns on the first switch SW1 and turns off the second switch SW2 during the normal operation period.

Referring to FIG. 6, in the fourth test period TP4, the top power switch signal PST has the high logic level, and the bottom power switch signal PSB has the low logic level, so that the first control circuit 511 turns off the first switch SW1 and the second switch SW2. Moreover, during the fourth test period TP4, the second control circuit 512 turns off the third switch SW3, turns on the fourth switch SW4 and controls the second selector S2 to couple the second terminal of the fourth switch SW4 to the second terminal of the second resistor R2.

The second control circuit 512 detects the second terminal of the fourth switch SW4 during the fourth test period TP4. When the TSV structure 101 has a leakage path to the substrate, the substrate voltage of the TSV structure 101 pulls down the voltage SS2 at the second terminal of the fourth switch SW4 to be close to the substrate voltage (e.g., ground voltage). Once the second control circuit 512 detects that the voltage SS2 at the second terminal of the fourth switch SW4 is the ground voltage (or is close to the ground voltage) during the fourth test period TP4, it represents that the TSV structure 101 has a leakage path to the substrate.

Comparatively, when the TSV structure 101 is effective (good), the voltage SS2 at the second terminal of the fourth switch SW4 is pulled up to be close to the first voltage V1 by the second resistor R2. Once the second control circuit 512 detects that the voltage SS2 at the second terminal of the fourth switch SW4 is the first voltage V1 (or is close to the first voltage V1) during the fourth test period TP4, it represents that the TSV structure 101 is effective (good). After the second control circuit 512 determines that the TSV structure 101 is effective (good) during the fourth test period TP4, the second control circuit 512 turns on the third switch SW3 and turns off the fourth switch SW4 during the normal operation period.

In another embodiment, referring to FIG. 4, the testing and repairing apparatus 100 further includes a redundant TSV structure 102, a fifth switch SW5 and a sixth switch SW6. The redundant TSV structure 102 is disposed between the first chip CHIP1 and the second chip CHIP2. The fifth switch SW5 is disposed in the first chip CHIP1. A first terminal of the fifth switch SW5 is coupled to a first terminal of the redundant TSV structure 102, and a second terminal of the fifth switch SW5 is coupled to the function unit 501 of the first chip CHIP1. The sixth switch SW6 is disposed in the second chip CHIP2. A first terminal of the sixth switch SW6 is coupled to a second terminal of the redundant TSV structure 102, and a second terminal of the sixth switch SW6 is coupled to the function unit 502 of the second chip CHIP2.

If the first control circuit 511 detects that the voltage SS1 at the second terminal of the second switch SW2 is the first voltage V1 during the first test period TP1, or the second control circuit 512 detects that the voltage SS2 at the second terminal of the fourth switch SW4 is the first voltage V1 during the second test period TP2, or the first control circuit 511 detects that the voltage SS1 at the second terminal of the second switch SW2 is the second voltage V2 during the third test period TP3, or the second control circuit 512 detects that the voltage SS2 at the second terminal of the fourth switch SW4 is the second voltage V2 during the fourth test period TP4, in the normal operation period, the first control circuit 511 turns off the first switch SW1 and turns on the fifth switch SW5, and the second control circuit 512 turns off the third switch SW3 and turns on the sixth switch SW6. Therefore, if the TSV structure 101 is failed, the testing and repairing apparatus 100 can switch the signal path to replace the failed TSV structure 101 by the good redundant TSV structure 102.

Figure 7:
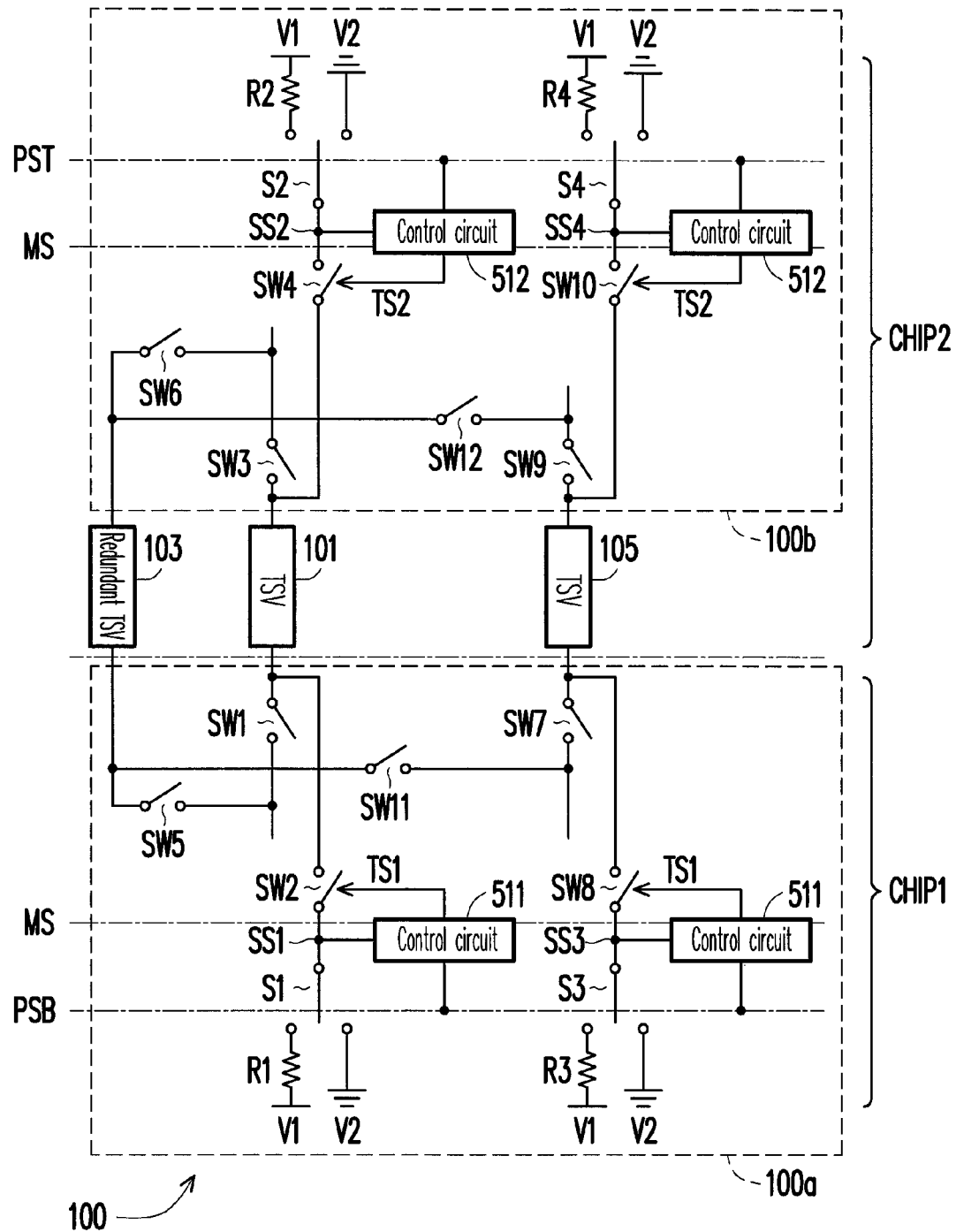
FIG. 7 is a circuit schematic diagram of the testing and repairing apparatus of FIG. 1 according to another embodiment of the disclosure.

FIG. 7 is a circuit schematic diagram of the testing and repairing apparatus 100 of FIG. 1 according to another embodiment of the disclosure. The embodiment of FIG. 7 is similar to the embodiment of FIG. 4, and differences there between are that in the embodiment of FIG. 7, a TSV structure 105 is further disposed between the chip CHIP1 and the chip CHIP2, and the testing and repairing apparatus 100 further includes a seventh switch SW7, an eighth switch SW8, a ninth switch SW9, a tenth switch SW10, a third resistor R3, a fourth resistor R4, a third selector S3 and a fourth selector S4. The seventh switch SW7, the eighth switch SW8, the third resistor R3, the third selector S3 and an eleventh switch SW11 are disposed in the chip CHIP1, and the ninth switch SW9, the tenth switch SW10, the fourth resistor R4, the fourth selector S4 and a twelfth switch SW12 are disposed in the chip CHIP2.

First terminals of the seventh switch SW7 and the eighth switch SW8 are coupled to a first terminal of the TSV structure 105. A second terminal of the seventh switch SW7 is coupled to a function unit of the chip CHIP1. A first terminal of the third resistor R3 is coupled to the first voltage V1. The third selector S3 is coupled between a second terminal of the eighth switch SW8 and a second terminal of the third resistor R3, and the third selector S3 is coupled between the second terminal of the eighth switch SW8 and the second voltage V2. The first control circuit 511 controls the seventh switch SW7, the eighth switch SW8, the eleventh switch SW11 and the third selector S3. The first control circuit 511 further detects the second terminal of the eighth switch SW8.

First terminals of the ninth switch SW9 and the tenth switch SW10 are coupled to a second terminal of the TSV structure 105. A second terminal of the ninth switch SW9 is coupled to a function unit of the chip CHIP2. The fourth selector S4 is coupled between a second terminal of the tenth switch SW10 and the second voltage V2, and the fourth selector S4 is coupled between the second terminal of the tenth switch SW10 and a second terminal of the fourth resistor R4. The second control circuit 512 controls the ninth switch SW9, the tenth switch SW10, the twelfth switch SW12 and the fourth selector S4. The second control circuit 512 further detects the second terminal of the tenth switch SW10.

Referring to FIG. 5 and FIG. 7, during the first test period TP1, the first control circuit 511 turns off the first switch SW1 and the seventh switch SW7, turns on the second switch SW2 and the eighth switch SW8, and controls the first selector S1 to couple the second terminal of the second switch SW2 to the second terminal of the first resistor R1 and controls the third selector S3 to couple the second terminal of the eighth switch SW8 to the second terminal of the third resistor R3. Moreover, during the first test period TP1, the second control circuit 512 turns off the third switch SW3 and the ninth switch SW9, turns on the fourth switch SW4 and the tenth switch SW10, and controls the second selector S2 to couple the second terminal of the fourth switch SW4 to the second voltage V2 and controls the fourth selector S4 to couple the second terminal of the tenth switch SW10 to the second voltage V2.

During the second test period TP2, the first control circuit 511 turns off the first switch SW1 and the seventh switch SW7, turns on the second switch SW2 and the eighth switch SW8, and controls the first selector S1 to couple the second terminal of the second switch SW2 to the second voltage V2 and controls the third selector S3 to couple the second terminal of the eighth switch SW8 to the second voltage V2. Moreover, during the second test period TP2, the second control circuit 512 turns off the third switch SW3 and the ninth switch SW9, turns on the fourth switch SW4 and the tenth switch SW10, and controls the second selector S2 to couple the second terminal of the fourth switch SW4 to the second terminal of the second resistor R2 and controls the fourth selector S4 to couple the second terminal of the tenth switch SW10 to the second terminal of the fourth resistor R4.

When the TSV structure 101 is effective (good) and the TSV structure 105 is open-circuited, the first control circuit 511 detects that the voltage SS1 at the second terminal of the second switch SW2 is the second voltage V2 (or is close to the second voltage V2) during the first test period TP1, and detects that a voltage SS3 at the second terminal of the eighth switch SW8 is the first voltage V1 (or is close to the first voltage V1). The second control circuit 512 detects that the voltage SS2 at the second terminal of the fourth switch SW4 is the second voltage V2 (or is close to the second voltage V2) during the second test period TP2, and detects that a voltage SS4 at the second terminal of the tenth switch SW10 is the first voltage V1 (or is close to the first voltage V1). Therefore, the first control circuit 511 turns off the second switch SW2, the fifth switch SW5, the seventh switch SW7 and the eighth switch SW8 during the normal operation period, and turns on the first switch SW1 and the eleventh switch SW11. Correspondingly, the second control circuit 512 turns off the fourth switch SW4, the sixth switch SW6, the ninth switch SW9 and the tenth switch SW10 during the normal operation period, and turns on the third switch SW3 and the twelfth switch SW12.

Comparatively, when the TSV structure 101 is open-circuited and the TSV structure 105 is effective (good), the first control circuit 511 detects that the voltage SS1 at the second terminal of the second switch SW2 is the first voltage V1 (or is close to the first voltage V1) during the first test period TP1, and detects that a voltage SS3 at the second terminal of the eighth switch SW8 is the second voltage V2 (or is close to the second voltage V2). The second control circuit 512 detects that the voltage SS2 at the second terminal of the fourth switch SW4 is the first voltage V1 (or is close to the first voltage V1) during the second test period TP2, and detects that the voltage SS4 at the second terminal of the tenth switch SW10 is the second voltage V2 (or is close to the second voltage V2). Therefore, the first control circuit 511 turns off the first switch SW1, the second switch SW2, the eighth switch SW8 and the eleventh switch SW11 during the normal operation period, and turns on the fifth switch SW5 and the seventh switch SW7. Correspondingly, the second control circuit 512 turns off the third switch SW3, the fourth switch SW4, the tenth switch SW10 and the twelfth switch SW12 during the normal operation period, and turns on the sixth switch SW6 and the ninth switch SW9.

Referring to FIG. 6 and FIG. 7, during the third test period TP3, the first control circuit 511 turns off the first switch SW1 and the seventh switch SW7, turns on the second switch SW2 and the eighth switch SW8, and controls the first selector S1 to couple the second terminal of the second switch SW2 to the second terminal of the first resistor R1 and controls the third selector S3 to couple the second terminal of the eighth switch SW8 to the second terminal of the third resistor R3. The second control circuit 512 turns off the third switch SW3, the fourth switch SW4, the ninth switch SW9 and the tenth switch SW10 during the third test period TP3.

During the fourth test period TP4, the first control circuit 511 turns off the first switch SW1, the second switch SW2, the seventh switch SW7 and the eighth switch SW8. Moreover, during the fourth test period TP4, the second control circuit 512 turns off the third switch SW3 and the ninth switch SW9, turns on the fourth switch SW4 and the tenth switch SW10, and controls the second selector S2 to couple the second terminal of the fourth switch SW4 to the second terminal of the second resistor R2 and controls the fourth selector S4 to couple the second terminal of the tenth switch SW10 to the second terminal of the fourth resistor R4.

When the TSV structure 101 is effective (good) and the TSV structure 105 has a leakage path to the substrate, the first control circuit 511 detects that the voltage SS1 at the second terminal of the second switch SW2 is the first voltage V1 (or is close to the first voltage V1) during the third test period TP3, and detects that a voltage SS3 at the second terminal of the eighth switch SW8 is the substrate voltage (or is close to the ground voltage). The second control circuit 512 detects that the voltage SS2 at the second terminal of the fourth switch SW4 is the first voltage V1 (or is close to the first voltage V1) during the fourth test period TP4, and detects that a voltage SS4 at the second terminal of the tenth switch SW10 is the substrate voltage (or is close to the ground voltage). Therefore, the first control circuit 511 turns off the second switch SW2, the fifth switch SW5, the seventh switch SW7 and the eighth switch SW8 during the normal operation period, and turns on the first switch SW1 and the eleventh switch SW11. Correspondingly, the second control circuit 512 turns off the fourth switch SW4, the sixth switch SW6, the ninth switch SW9 and the tenth switch SW10 during the normal operation period, and turns on the third switch SW3 and the twelfth switch SW12.

Comparatively, when the TSV structure 101 has a leakage path to the substrate and the TSV structure 105 is effective (good), the first control circuit 511 detects that the voltage SS1 at the second terminal of the second switch SW2 is the substrate voltage (or is close to the ground voltage) during the third test period TP3, and detects that a voltage SS3 at the second terminal of the eighth switch SW8 is the first voltage V1 (or is close to the first voltage V1). The second control circuit 512 detects that the voltage SS2 at the second terminal of the fourth switch SW4 is the substrate voltage (or is close to the ground voltage) during the fourth test period TP4, and detects that the voltage SS4 at the second terminal of the tenth switch SW10 is the first voltage V1 (or is close to the first voltage V1). Therefore, the first control circuit 511 turns off the first switch SW1, the second switch SW2, the eighth switch SW8 and the eleventh switch SW11 during the normal operation period, and turns on the fifth switch SW5 and the seventh switch SW7. Correspondingly, the second control circuit 512 turns off the third switch SW3, the fourth switch SW4, the tenth switch SW10 and the twelfth switch SW12 during the normal operation period, and turns on the sixth switch SW6 and the ninth switch SW9.

Figure 8:
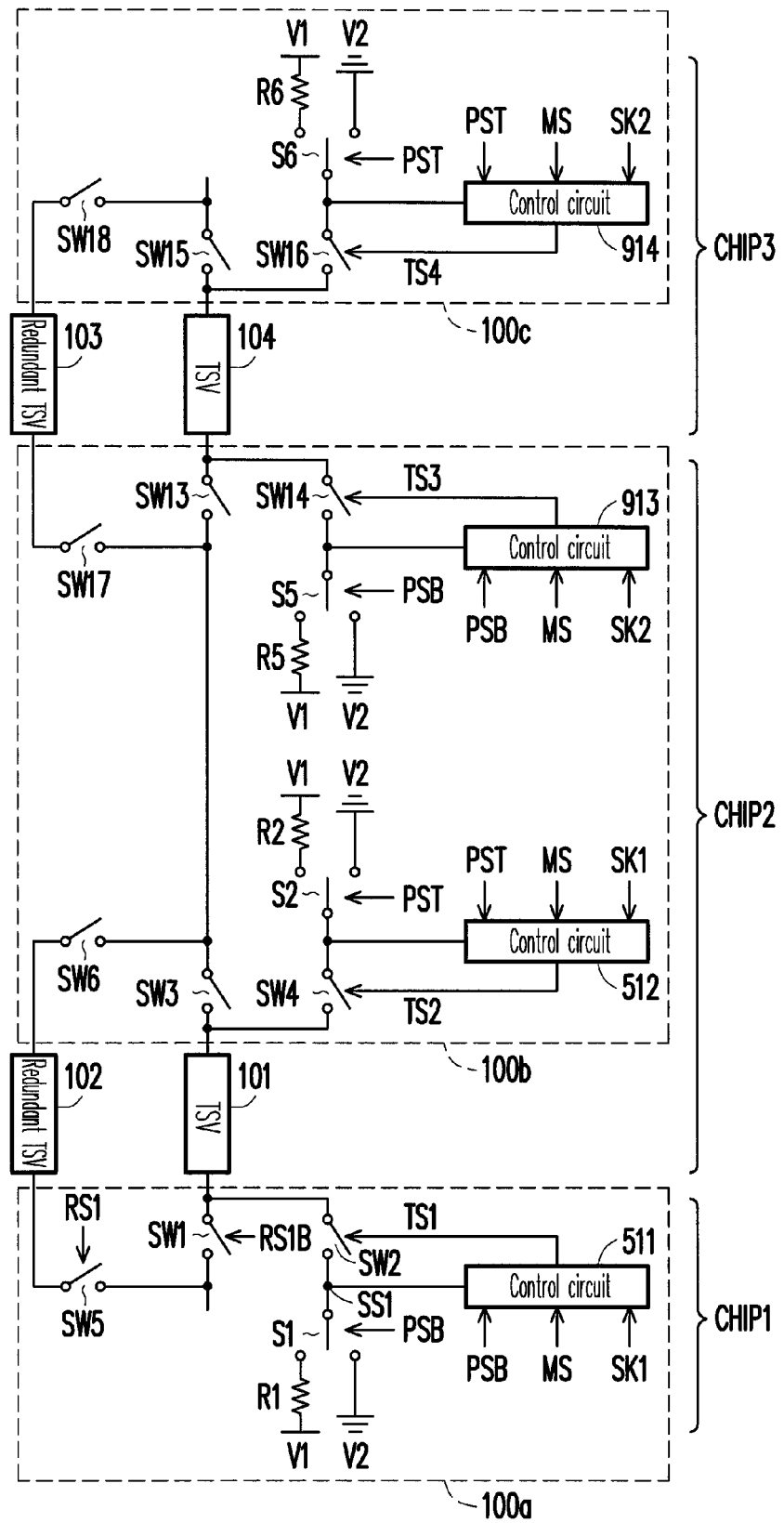
FIG. 8 is a circuit schematic diagram of the testing and repairing apparatus of FIG. 1 according to still another embodiment of the disclosure.

FIG. 8 is a circuit schematic diagram of the testing and repairing apparatus 100 of FIG. 1 according to still another embodiment of the disclosure. The embodiment of FIG. 8 can refer to related descriptions of the embodiments of FIG. 4 and FIG. 5, and different to the embodiment of FIG. 4, in the embodiment of FIG. 8, the stacked-chip further includes a chip CHIP3, and a TSV structure 104 and a redundant TSV structure 103 are configured between the chip CHIP2 and the chip CHIP3. The testing and repairing apparatus 100b disposed in the chip CHIP2 further includes a switch SW13, a switch SW14, a switch SW17, a resistor R5, a selector S5 and a control circuit 913. The testing and repairing apparatus 100c disposed in the chip CHIP3 includes a switch SW15, a switch SW16, a switch SW18, a resistor R6, a selector S6 and a control circuit 914.

First terminals of the switch SW13 and the switch SW14 are coupled to a first terminal of the TSV structure 104. A second terminal of the switch SW13 is coupled to a function unit of the chip CHIP2. A first terminal of the resistor R5 is coupled to the first voltage V1. The selector S5 is coupled between a second terminal of the switch SW14 and a second terminal of the resistor R5, and the selector S5 is coupled between the second terminal of the switch SW14 and the second voltage V2. The control circuit 913 controls the switch SW13, the switch SW14, the switch SW17 and the selector S5, and detects the second terminal of the switch SW14.

First terminals of the switch SW15 and the switch SW16 are coupled to a second terminal of the TSV structure 104. A second terminal of the switch SW15 is coupled to a function unit of the chip CHIP3. The selector S6 is coupled between a second terminal of the switch SW16 and the second voltage V2, and the selector S6 is coupled between the second terminal of the switch SW16 and a second terminal of the resistor R6. A first terminal of the resistor R6 is coupled to the first voltage V1. The control circuit 914 controls the switch SW15, the switch SW16, the switch SW18 and the selector S6, and detects the second terminal of the switch SW16.

Figure 9:
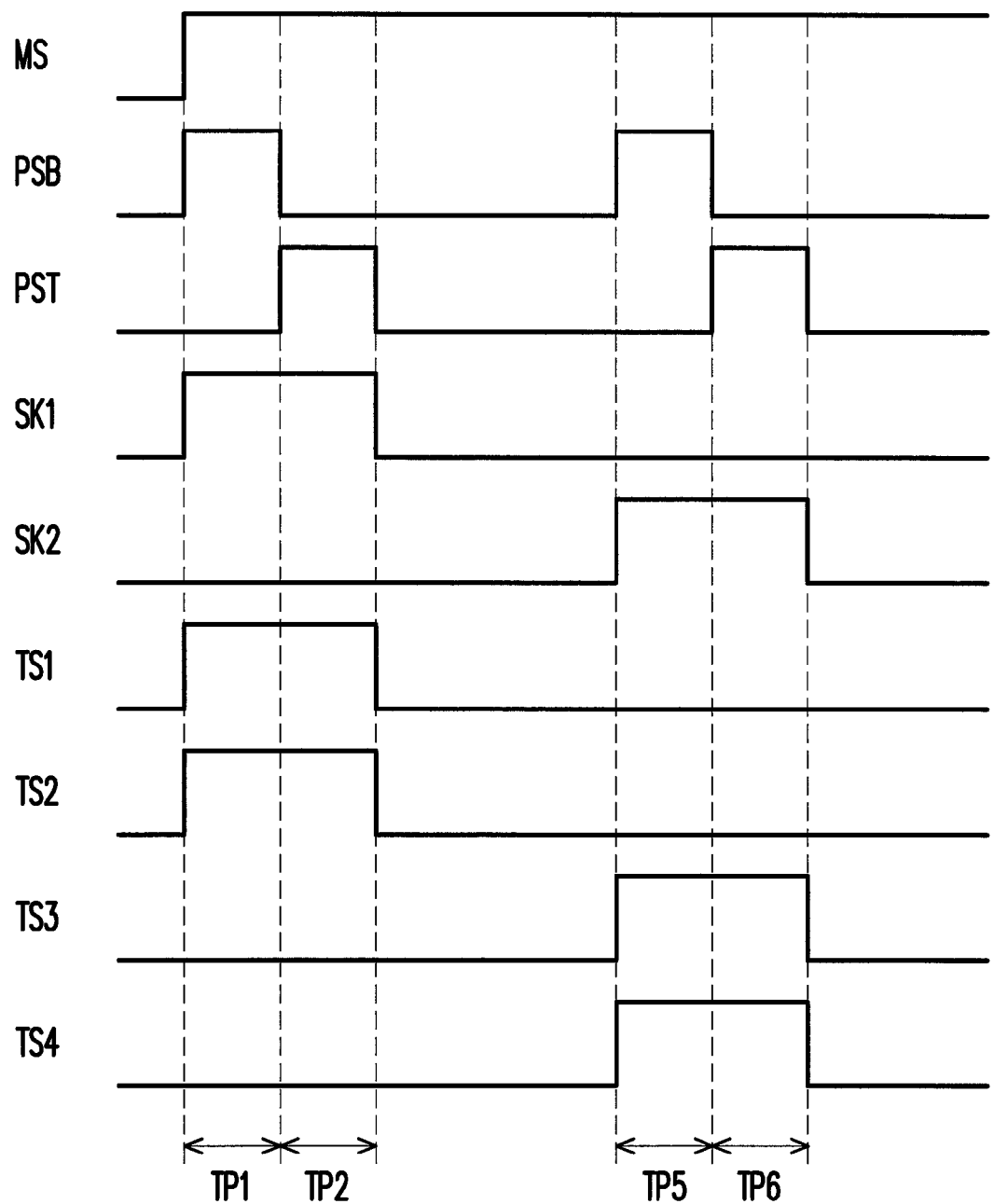
FIG. 9 is a timing schematic diagram of control signals of FIG. 8 according to an embodiment of the disclosure.

FIG. 9 is a timing schematic diagram of control signals of FIG. 8 according to an embodiment of the disclosure. In FIG. 9, the mode selection signal MS has a high logic level, which represents an open circuit testing mode. The embodiment of FIG. 9 can refer to the related descriptions of FIG. 5, and different to FIG. 5, the embodiment of FIG. 8 and FIG. 9 further has stacking control signals SK1 and SK2. The staking control signals SK1 and SK2 are external control signals. The control circuits 511 and 512 are controlled by the stacking control signal SK1, and the control circuits 913 and 914 are controlled by the stacking control signal SK2. When the stacking control signal SK1 has the high logic level, it enables the control circuits 511 and 512. When the stacking control signal SK2 has the high logic level, it enables the control circuits 913 and 914.

Referring to FIG. 8 and FIG. 9, in the first test period TP1, the bottom power switch signal PSB and the stacking control signal SK1 have the high logic level, and the top power switch signal PST and the stacking control signal SK2 have the low logic level, so that the control circuit 511 turns off the switch SW1, turns on the switch SW2 and controls the selector S1 to couple the second terminal of the switch SW2 to the second terminal of the resistor R1. Moreover, during the first test period TP1, the control circuit 512 turns off the switch SW3, turns on the switch SW4 and controls the selector S2 to couple the second terminal of the switch SW4 to the second voltage V2. The control circuit 913 turns off the switch SW14 through a third test signal TS3 during the first test period TP1. The control circuit 914 turns off the switch SW16 through a fourth test signal TS4 during the first test period TP1.

In the second test period TP2, the top power switch signal PST and the stacking control signal SK1 have the high logic level, and the bottom power switch signal PSB and the stacking control signal SK2 have the low logic level, so that the control circuit 511 turns off the switch SW1, turns on the switch SW2 and controls the selector S1 to couple the second terminal of the switch SW2 to the second voltage V2. Moreover, in the second test period TP2, the control circuit 512 turns off the switch SW3, turns on the switch SW4 and controls the selector S2 to couple the second terminal of the switch SW4 to the second terminal of the resistor R2. The control circuit 913 turns off the switch SW14 through the third test signal TS3 during the second test period TP2. The control circuit 914 turns off the switch SW16 through the fourth test signal TS4 during the second test period TP2.

In a fifth test period TP5, the bottom power switch signal PSB and the stacking control signal SK2 have the high logic level, and the top power switch signal PST and the stacking control signal SK1 have the low logic level, so that the control circuit 511 turns off the switch SW2 through the first test signal TS1 during the fifth test period TP5. The control circuit 512 turns off the switch SW4 through the second test signal TS2 during the fifth test period TP5. During the fifth test period TP5, the control circuit 913 turns off the switch SW13, turns on the switch SW14, and controls the selector S5 to couple the second terminal of the switch SW14 to the second terminal of the resistor R5. During the fifth test period TP5, the control circuit 914 turns off the switch SW15, turns on the switch SW16, and controls the selector S6 to couple the second terminal of the switch SW16 to the second voltage V2.

In a sixth test period TP6, the top power switch signal PST and the stacking control signal SK2 have the high logic level, and the bottom power switch signal PSB and the stacking control signal SK1 have the low logic level, so that the control circuit 511 turns off the switch SW2 through the first test signal TS1 during the sixth test period TP5. The control circuit 512 turns off the switch SW4 through the second test signal TS2 during the sixth test period TP6. During the sixth test period TP6, the control circuit 913 turns off the switch SW13, turns on the switch SW14, and controls the selector S5 to couple the second terminal of the switch SW14 to the second voltage V2. During the sixth test period TP6, the control circuit 914 turns off the switch SW15, turns on the switch SW16, and controls the selector S6 to couple the second terminal of the switch SW16 to the second terminal of the resistor R6.

Figure 10:
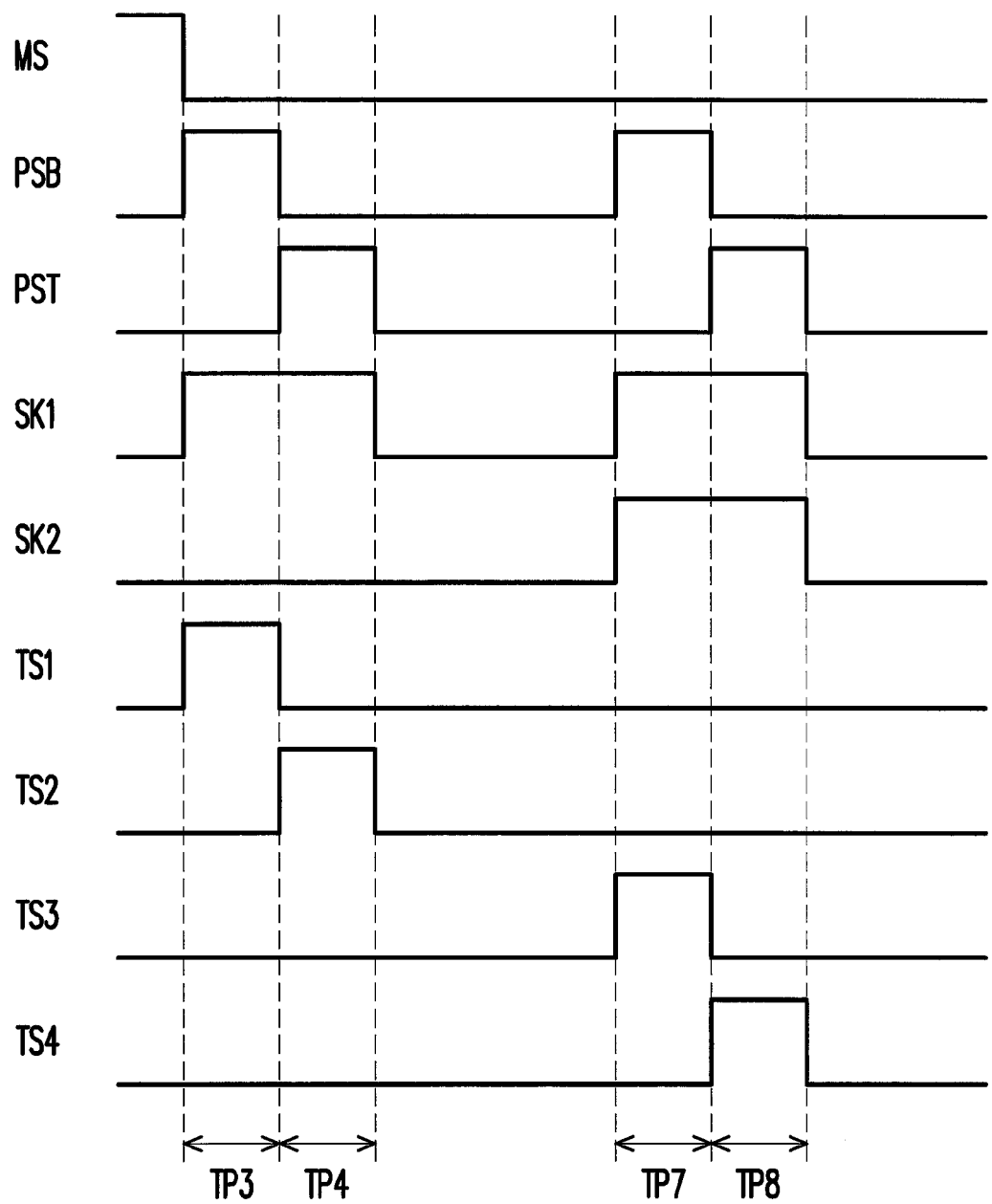
FIG. 10 is a timing schematic diagram of control signals of FIG. 8 according to another embodiment of the disclosure.

FIG. 10 is a timing schematic diagram of control signals of FIG. 8 according to another embodiment of the disclosure. The mode selection signal MS has a low logic level, which represents a short circuit testing mode. The embodiment of FIG. 10 can refer to the related descriptions of FIG. 6, and different to FIG. 6, the embodiment of FIG. 10 further has the stacking control signals SK1 and SK2.

Referring to FIG. 8 and FIG. 10, in the third test period TP3, the bottom power switch signal PSB and the stacking control signal SK1 have the high logic level, and the top power switch signal PST and the stacking control signal SK2 have the low logic level, so that the control circuit 511 turns off the switch SW1, turns on the switch SW2 and controls the selector S1 to couple the second terminal of the switch SW2 to the second terminal of the resistor R1. Moreover, the control circuit 512 turns off the switch SW3 and the switch SW4 during the third test period TP3. The control circuit 913 turns off the switch SW14 through the third test signal TS3 during the third test period TP3. The control circuit 914 turns off the switch SW16 through the fourth test signal TS4 during the third test period TP3.

In the fourth test period TP4, the top power switch signal PST and the stacking control signal SK1 have the high logic level, and the bottom power switch signal PSB and the stacking control signal SK2 have the low logic level, so that the control circuit 511 turns off the switch SW1 and the switch SW2. Moreover, in the fourth test period TP4, the control circuit 512 turns off the switch SW3, turns on the switch SW4 and controls the selector S2 to couple the second terminal of the switch SW4 to the second terminal of the resistor R2. The control circuit 913 turns off the switch SW14 through the third test signal TS3 during the fourth test period TP4. The control circuit 914 turns off the switch SW16 through the fourth test signal TS4 during the fourth test period TP4.

In a seventh test period TP7, the bottom power switch signal PSB and the stacking control signal SK2 have the high logic level, and the top power switch signal PST and the stacking control signal SK1 have the low logic level, so that the control circuit 511 turns off the switch SW2 through the first test signal TS1 during the seventh test period TP7. The control circuit 512 turns off the switch SW4 through the second test signal TS2 during the seventh test period TP7. During the seventh test period TP7, the control circuit 913 turns off the switch SW13, turns on the switch SW14, and controls the selector S5 to couple the second terminal of the switch SW14 to the second terminal of the resistor R5. The control circuit 914 turns off the switch SW15 and the switch SW16 during the seventh test period TP7.

In an eighth test period TP8, the top power switch signal PST and the stacking control signal SK2 have the high logic level, and the bottom power switch signal PSB and the stacking control signal SK1 have the low logic level, so that the control circuit 511 turns off the switch SW2 through the first test signal TS1 during the eighth test period TP8. The control circuit 512 turns off the switch SW4 through the second test signal TS2 during the eighth test period TP8. The control circuit 913 turns off the switch SW13 and the switch SW14 during the eighth test period TP8. During the eighth test period TP8, the control circuit 914 turns off the switch SW15, turns on the switch SW16, and controls the selector S6 to couple the second terminal of the switch SW16 to the second terminal of the resistor R6.

If the control circuit 913 detects that the voltage at the second terminal of the switch SW14 is the first voltage V1 during the test period TP5, or the control circuit 914 detects that the voltage at the second terminal of the switch SW16 is the first voltage V1 during the test period TP6, or the control circuit 913 detects that the voltage at the second terminal of the switch SW14 is the second voltage V2 during the test period TP7, or the control circuit 914 detects that the voltage at the second terminal of the switch SW16 is the second voltage V2 during the test period TP8, in the normal operation period, the control circuit 913 turns off the switch SW13 and turns on the switch SW17, and the control circuit 914 turns off the switch SW15 and turns on the switch SW18. Therefore, if the TSV structure 104 is failed, the testing and repairing apparatus 100 can switch the signal path to replace the failed TSV structure 101 by the good redundant TSV structure 103.

Figure 11:
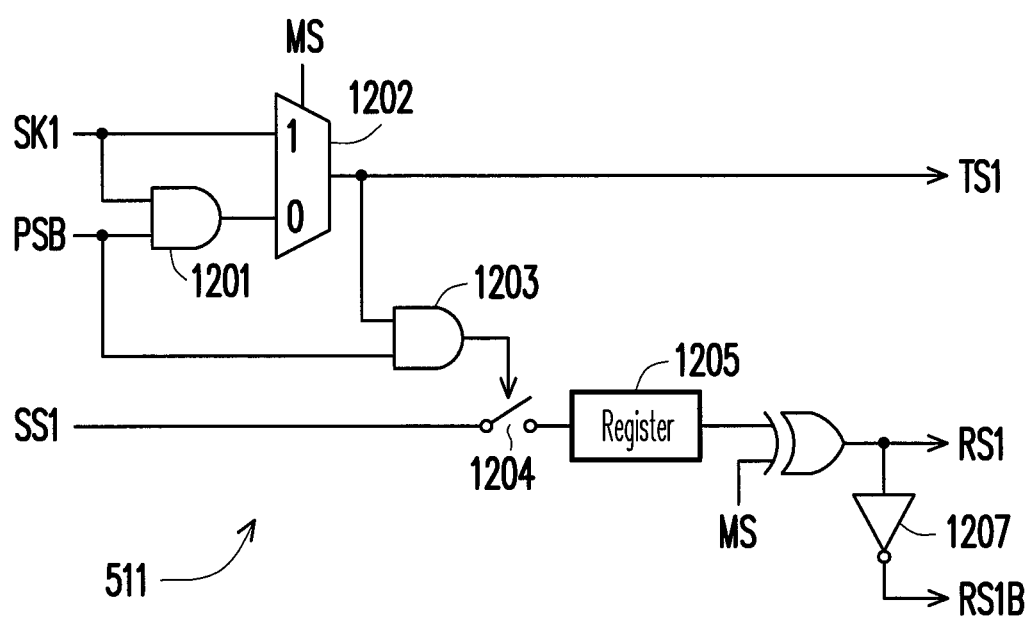
FIG. 11 is a circuit schematic diagram of a control circuit of FIG. 8 according to an embodiment of the disclosure.

FIG. 11 is a circuit schematic diagram of the control circuit 511 of FIG. 8 according to an embodiment of the disclosure. Implementations of the other control circuits 512, 913 and 914 can be deuced according to descriptions of FIG. 11. The control circuit 511 includes a first AND gate 1201, a multiplexer 1202, a second AND gate 1203, a sampling switch 1204, a register 1205, an exclusive-OR (XOR) gate 1206 and a NOT gate 1207. A first input terminal and a second input terminal of the first AND gate 1201 respectively receive the stacking control signal SK1 and the bottom power switch signal PSB. The bottom power switch signal PSB is used to control the selector S1, and the stacking control signal SK1 is used to enable the control signal 511. A control terminal of the multiplexer 1202 receives the mode selection signal MS, a first selection terminal of the multiplexer 1202 is coupled to an output terminal of the first AND gate 1201, a second selection terminal of the multiplexer 1202 receives the stacking control signal SK1, and a common terminal of the multiplexer 1202 outputs the first test signal TS1 to a control terminal of the second switch SW2. If the mode selection signal MS has the high logic level, the common terminal of the multiplexer 1202 outputs the stacking control signal SK1. If the mode selection signal MS has the low logic level, the common terminal of the multiplexer 1202 outputs the output signal of the first AND gate 1201. A signal timing diagram of the first test signal TS1 is as that shown in FIG. 9 and FIG. 10.

A first input terminal and a second input terminal of the second AND gate 1203 respectively receive the first test signal TS1 and the bottom power switch signal PSB. A first terminal of the sampling switch 1204 is coupled to the second terminal of the second switch SW2, and a control terminal of the sampling switch 1204 is coupled to an output terminal of the second AND gate 1203. An input terminal of the register 1205 is coupled to a second terminal of the sampling switch 1204. If an output signal of the second AND gate 1203 has the high logic level, the sampling switch 1204 is turned on, and the register 1205 records the voltage SS1 at the output terminal of the second AND gate 1203 through the sampling switch 1204. If the output signal of the second AND gate 1203 has the low logic level, the sampling switch 1204 is turned off, and the register 1205 stores the previously recorded voltage SS1. A first input terminal of the XOR gate 1206 receives the mode selection signal MS, and a second input terminal of the XOR gate 1206 is coupled to an output terminal of the register 1205. An output terminal of the XOR gate 1206 is coupled to the control terminal of the fifth switch SW5, and coupled to the control terminal of the first switch SW1 through the NOT gate 1207. The control circuit 511 respectively controls the switch SW1 and the switch SW5 through a control signal RS1 and a control signal RS1B, where the control signal RS1B is an inverted signal of the control signal RS1.

In summary, in the testing and repairing apparatus 100 shown in FIG. 8, each signal line containing the TSV in the circuit is self-tested to determine whether the TSV is open-circuited or has a leakage path to the substrate. After the failed TSV is detected, the testing and repairing apparatus 100 can self-repair the failed TSV, i.e. uses the redundant TSV to replace the failed TSV, so as to guarantee a normal operation of the whole stacked-chip and improve a yield of the whole circuit.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A testing and repairing apparatus of through silicon via (TSV) in a stacked-chip, adapted to test a first TSV structure disposed between a first chip and a second chip in the stacked-chip, the testing and repairing apparatus comprising:
    a first switch and a second switch, disposed in the first chip, wherein first terminals of the first switch and the second switch are coupled to a first terminal of the TSV structure, and a second terminal of the first switch is coupled to a function unit of the first chip;
    a third switch and a fourth switch, disposed in the second chip, wherein first terminals of the third switch and the fourth switch are coupled to a second terminal of the TSV structure, and a second terminal of the third switch is coupled to a function unit of the second chip;
    a first resistor, disposed in the first chip, wherein a first terminal of the first resistor is coupled to a first voltage;
    a first selector, disposed in the first chip, and coupled between a second terminal of the second switch and a second terminal of the first resister;
    a second selector, disposed in the second chip, and coupled between a second terminal of the fourth switch and a second voltage;
    a first control circuit, disposed in the first chip, detecting the second terminal of the second switch, and controlling the first switch, the second switch and the first selector; and
    a second control circuit, disposed in the second chip, and controlling the third switch, the fourth switch and the second selector.

2. The testing and repairing apparatus of TSV in stacked-chip as claimed in claim 1, wherein during a first test period, the first control circuit turns off the first switch, turns on the second switch and controls the first selector to couple the second terminal of the second switch to the second terminal of the first resistor, and the second control circuit turns off the third switch, turns on the fourth switch and controls the second selector to couple the second terminal of the fourth switch to the second voltage.

3. The testing and repairing apparatus of TSV in stacked-chip as claimed in claim 2, further comprising:
a second resistor, disposed in the second chip, wherein a first terminal of the second resistor is coupled to the first voltage, and a second terminal of the second resistor is coupled to the second selector,
wherein the first selector is further coupled to the second voltage, and during a second test period; the first control circuit turns off the first switch, turns on the second switch and controls the first selector to couple the second terminal of the second switch to the second voltage; and the second control circuit turns off the third switch, turns on the fourth switch, controls the second selector to couple the second terminal of the fourth switch to the second terminal of the second resistor, and detects the second terminal of the fourth switch.

4. The testing and repairing apparatus of TSV in stacked-chip as claimed in claim 3, further comprising:
a first redundant TSV structure, disposed between the first chip and the second chip;
a fifth switch, disposed in the first chip, wherein a first terminal of the fifth switch is coupled to a first terminal of the first redundant TSV structure, and a second terminal of the fifth switch is coupled to the function unit of the first chip; and
a sixth switch, disposed in the second chip, wherein a first terminal of the sixth switch is coupled to a second terminal of the first redundant TSV structure, and a second terminal of the sixth switch is coupled to the function unit of the second chip,
wherein the first control circuit turns off the first switch and turns on the fifth switch and the second control circuit turns off the third switch and turns on the sixth switch in a normal operation period if the first control circuit detects that a voltage at the second terminal of the second switch is the first voltage during the first test period, or the second control circuit detects that a voltage at the second terminal of the fourth switch is the first voltage during the second test period.

5. The testing and repairing apparatus of TSV in stacked-chip as claimed in claim 4, wherein during a third test period, the first control circuit turns off the first switch, turns on the second switch and controls the first selector to couple the second terminal of the second switch to the second terminal of the first resistor, and the second control circuit turns off the third switch and the fourth switch.

6. The testing and repairing apparatus of TSV in stacked-chip as claimed in claim 5,
wherein during a fourth test period, the first control circuit turns off the first switch and the second switch, and the second control circuit turns off the third switch, turns on the fourth switch, controls the second selector to couple the second terminal of the fourth switch to the second terminal of the second resistor, and detects the second terminal of the fourth switch.

7. The testing and repairing apparatus of TSV in stacked-chip as claimed in claim 3, further comprising:
a redundant TSV structure, disposed between the first chip and the second chip;
a fifth switch, disposed in the first chip, wherein a first terminal of the fifth switch is coupled to a first terminal of the redundant TSV structure, and a second terminal of the fifth switch is coupled to the function unit of the first chip; and
a sixth switch, disposed in the second chip, wherein a first terminal of the sixth switch is coupled to a second terminal of the redundant TSV structure, and a second terminal of the sixth switch is coupled to the function unit of the second chip,
wherein the first control circuit turns off the first switch and turns on the fifth switch, and the second control circuit turns off the third switch and turns on the sixth switch in a normal operation period if the first control circuit detects that a voltage at the second terminal of the second switch is the second voltage during a third test period, or the second control circuit detects that a voltage at the second terminal of the fourth switch is the second voltage during a fourth test period.

8. The testing and repairing apparatus of TSV in stacked-chip as claimed in claim 6, wherein a second TSV structure is configured between the first chip and the second chip, and the testing and repairing apparatus further comprises:
a seventh switch and an eighth switch, disposed in the first chip, wherein first terminals of the seventh switch and the eighth switch are coupled to a first terminal of the second TSV structure, and a second terminal of the seventh switch is coupled to a second function unit of the first chip;
a ninth switch and a tenth switch, disposed in the second chip, wherein first terminals of the ninth switch and the tenth switch are coupled to a second terminal of the second TSV structure, and a second terminal of the ninth switch is coupled to a second function unit of the second chip;
a third resistor, disposed in the first chip, and having a first terminal coupled to the first voltage;
a third selector, disposed in the first chip, and coupled between a second terminal of the eighth switch and a second terminal of the third resistor; and
a fourth selector, disposed in the second chip, and coupled between a second terminal of the tenth switch and the second voltage,
wherein the first control circuit further detects the second terminal of the eighth switch, and controls the seventh switch, the eighth switch and the third selector, and the second control circuit controls the ninth switch, the tenth switch and the fourth selector.

9. The testing and repairing apparatus of TSV in stacked-chip as claimed in claim 8, wherein during the first test period, the first control circuit turns off the first switch and the seventh switch, turns on the second switch and the eighth switch, controls the first selector to couple the second terminal of the second switch to the second terminal of the first resistor, and controls the third selector to couple the second terminal of the eighth switch to the second terminal of the third resistor; and the second control circuit turns off the third switch and the ninth switch, turns on the fourth switch and the tenth switch, controls the second selector to couple the second terminal of the fourth switch to the second voltage, and controls the fourth selector to couple the second terminal of the tenth switch to the second voltage.

10. The testing and repairing apparatus of TSV in stacked-chip as claimed in claim 9, further comprising:
a fourth resistor, disposed in the second chip, wherein a first terminal of the fourth resistor is coupled to the first voltage, and a second terminal of the fourth resistor is coupled to the fourth selector,
wherein the first selector and the third selector are further coupled to the second voltage; the first control circuit turns off the first switch and the seventh switch, turns on the second switch and the eighth switch, controls the first selector to couple the second terminal of the second switch to the second voltage, and controls the third selector to couple the second terminal of the eighth switch to the second voltage during the second test period; and the second control circuit turns off the third switch and the ninth switch, turns on the fourth switch and the tenth switch, controls the second selector to couple the second terminal of the fourth switch to the second terminal of the second resistor, detects the second terminal of the fourth switch, controls the fourth selector to couple the second terminal of the tenth switch to the second terminal of the fourth resistor, and detects the second terminal of the tenth switch during the second test period.

11. The testing and repairing apparatus of TSV in stacked-chip as claimed in claim 10, wherein during the third test period, the first control circuit turns off the first switch and the seventh switch, turns on the second switch and the eighth switch, controls the first selector to couple the second terminal of the second switch to the second terminal of the first resistor and controls the third selector to couple the second terminal of the eighth switch to the second terminal of the third resistor, and the second control circuit turns off the third switch, the fourth switch, the ninth switch and the tenth switch; and during the fourth test period, the first control circuit turns off the first switch, the second switch, the seventh switch and the eighth switch, and the second control circuit turns off the third switch and the ninth switch, turns on the fourth switch and the tenth switch, controls the second selector to couple the second terminal of the fourth switch to the second terminal of the second resistor and controls the fourth selector to couple the second terminal of the tenth switch to the second terminal of the fourth resistor.

12. The testing and repairing apparatus of TSV in stacked-chip as claimed in claim 10, further comprising:
an eleventh switch, disposed in the first chip, wherein a first terminal of the eleventh switch is coupled to the first terminal of the first redundant TSV structure, and a second terminal of the eleventh switch is coupled to the second function unit of the first chip; and
a twelfth switch, disposed in the second chip, wherein a first terminal of the twelfth switch is coupled to the second terminal of the first redundant TSV structure, and a second terminal of the twelfth switch is coupled to the second function unit of the second chip.

13. The testing and repairing apparatus of TSV in stacked-chip as claimed in claim 1, wherein the first control circuit comprises:
a first AND gate, having a first input terminal and a second input terminal respectively receiving a stacking control signal and a bottom power switch signal, wherein the bottom power switch signal is used to control the first selector; and
a multiplexer, having a control terminal receiving a mode selection signal, a first selection terminal coupled to an output terminal of the first AND gate, a second selection terminal receiving the stacking control signal, and a common terminal outputting a first test signal to a control terminal of the second switch.

14. The testing and repairing apparatus of TSV in stacked-chip as claimed in claim 13, wherein the first control circuit further comprises:
a second AND gate, having a first input terminal and a second input terminal respectively receiving the first test signal and the bottom power switch signal;
a sampling switch, having a first terminal coupled to the second terminal of the second switch, and a control terminal coupled to an output terminal of the second AND gate;

a register, having an input terminal coupled to a second terminal of the sampling switch; and
an exclusive-OR (XOR) gate, having a first input terminal receiving the mode selection signal, a second input terminal coupled to an output terminal of the register, and an output terminal coupled to a control terminal of the first switch.

15. The testing and repairing apparatus of TSV in stacked-chip as claimed in claim 1, further comprising:
a signal transmitter, having an output terminal outputting an external control signal;
a first path detecting switch, having a first terminal coupled to the output terminal of the signal transmitter;
a first path detecting TSV structure, having a first terminal coupled to the output terminal of the signal transmitter;
a second path detecting TSV structure, having a first terminal coupled to a second terminal of the first path detecting TSV structure, and a second terminal coupled to the testing and repairing apparatus of the second chip;
a third path detecting TSV structure, having a first terminal coupled to the second terminal of the second path detecting TSV structure, and a second terminal coupled to the testing and repairing apparatus of the first chip;
a fourth path detecting TSV structure, having a first terminal coupled to the second terminal of the third path detecting TSV structure, and a second terminal coupled to a second terminal of the first path detecting switch;
a second path detecting switch, having a first terminal coupled to the second terminal of the fourth path detecting TSV structure; and
a signal receiver, having an input terminal coupled to a second terminal of the second path detecting switch.

16. The testing and repairing apparatus of TSV in stacked-chip as claimed in claim 12, wherein a third TSV structure is configured between the second chip and a third chip, and the testing and repairing apparatus further comprises:
a thirteenth switch and a fourteenth switch, disposed in the second chip, wherein first terminals of the thirteenth switch and the fourteenth switch are coupled to a first terminal of the third TSV structure, and a second terminal of the thirteenth switch is coupled to the function unit of the second chip;
a fifteenth switch and a sixteenth switch, disposed in the third chip, wherein first terminals of the fifteenth switch and the sixteenth switch are coupled to a second terminal of the third TSV structure, and a second terminal of the fifteenth switch is coupled to a function unit of the third chip;
a fifth resistor, disposed in the second chip, and having a first terminal coupled to the first voltage;
a fifth selector, disposed in the second chip, and coupled between a second terminal of the fourteenth switch and a second terminal of the fifth resistor;
a sixth selector, disposed in the third chip, and coupled between a second terminal of the sixteenth switch and the second voltage,
a third control circuit, disposed in the second chip, detecting the second terminal of the fourteenth switch, and controlling the thirteenth switch, the fourteenth switch and the fifth selector; and
a fourth control circuit, disposed in the third chip, and controlling the fifteenth switch, the sixteenth switch and the sixth selector.

17. The testing and repairing apparatus of TSV in stacked-chip as claimed in claim 16, wherein during the first test period, the third control circuit turns off the fourteenth switch, and the fourth control circuit turns off the sixteenth switch;

and during a fifth test period, the first control circuit turns off the second switch, the second control circuit turns off the fourth switch, the third control circuit turns off the thirteenth switch, turns on the fourteenth switch and controls the fifth selector to couple the second terminal of the fourteenth switch to the second terminal of the fifth resistor, and the fourth control circuit turns off the fifteenth switch, turns on the sixteenth switch and controls the sixth selector to couple the second terminal of the sixteenth switch to the second voltage.

18. The testing and repairing apparatus of TSV in stacked-chip as claimed in claim 17, further comprising:
a sixth resistor, disposed in the third chip, wherein a first terminal of the sixth resistor is coupled to the first voltage, and a second terminal of the sixth resistor is coupled to the sixth selector, wherein the fifth selector is further coupled to the second voltage; during the second test period, terminal of the fourth switch to the second terminal of the second resistor and detects the the third control circuit turns off the fourteenth switch, and the fourth control circuit turns off the sixteenth switch; and during a sixth test period, the first control circuit turns off the second switch, the second control circuit turns off the fourth switch, the third control circuit turns off the thirteenth switch, turns on the fourteenth switch and controls the fifth selector to couple the second terminal of the fourteenth switch to the second voltage, and the fourth control circuit turns off the fifteenth switch, turns on the sixteenth switch, controls the sixth selector to couple the second terminal of the sixteenth switch to the second terminal of the sixth resistor and detects the second terminal of the sixteenth switch.

19. The testing and repairing apparatus of TSV in stacked-chip as claimed in claim 18, further comprising:
a second redundant TSV structure, disposed between the second chip and the third chip;
a seventeenth switch, disposed in the second chip, wherein a first terminal of the seventeenth switch is coupled to the first terminal of the third TSV structure, and a second terminal of the seventeenth switch is coupled to the function unit of the second chip; and
an eighteenth switch, disposed in the third chip, wherein a first terminal of the eighteenth switch is coupled to the second terminal of the third TSV structure, and a second terminal of the eighteenth switch is coupled to the function unit of the third chip,
wherein the third control circuit turns off the thirteenth switch and turns on the seventeenth switch, and the fourth control circuit turns off the fifteenth switch and turns on the eighteenth switch in the normal operation period if the third control circuit detects that a voltage at the second terminal of the fourteenth switch is the first voltage during the fifth test period, or the fourth control circuit detects that a voltage at the second terminal of the sixteenth switch is the first voltage during the sixth test period.

20. The testing and repairing apparatus of TSV in stacked-chip as claimed in claim 16, wherein during the third test period, the third control circuit turns off the fourteenth switch, and the fourth control circuit turns off the sixteenth switch; and during a seventh test period, the first control circuit turns off the second switch, the second control circuit turns off the fourth switch, the third control circuit turns off the thirteenth switch, turns on the fourteenth switch and controls the fifth selector to couple the second terminal of the fourteenth switch to the second terminal of the fifth resistor, and the fourth control circuit turns off the fifteenth switch and the sixteenth switch.

21. The testing and repairing apparatus of TSV in stacked-chip as claimed in claim 20, further comprising:
a sixth resistor, disposed in the third chip, wherein a first terminal of the sixth resistor is coupled to the first voltage, and a second terminal of the sixth resistor is coupled to the sixth selector,
wherein the fifth selector is further coupled to the second voltage; during the fourth test period, the third control circuit turns off the fourteenth switch, and the fourth control circuit turns off the sixteenth switch; and during an eighth test period, the first control circuit turns off the second switch, the second control circuit turns off the fourth switch, the third control circuit turns off the thirteenth switch and the fourteenth switch, and the fourth control circuit turns off the fifteenth switch, turns on the sixteenth switch, controls the sixth selector to couple the second terminal of the sixteenth switch to the second terminal of the sixth resistor and detects the second terminal of the sixteenth switch.

22. The testing and repairing apparatus of TSV in stacked-chip as claimed in claim 21, further comprising:
a second redundant TSV structure, disposed between the second chip and the third chip;
a seventeenth switch, disposed in the second chip, wherein a first terminal of the seventeenth switch is coupled to the first terminal of the third TSV structure, and a second terminal of the seventeenth switch is coupled to the function unit of the second chip; and
an eighteenth switch, disposed in the third chip, wherein a first terminal of the eighteenth switch is coupled to the second terminal of the third TSV structure, and a second terminal of the eighteenth switch is coupled to the function unit of the third chip,
wherein the first control circuit turns off the first switch and turns on the fifth switch, and the second control circuit turns off the third switch and turns on the sixth switch in the normal operation period if the first control circuit detects that the voltage at the second terminal of the second switch is the second voltage during the third test period, or the second control circuit detects that the voltage at the second terminal of the fourth switch is the second voltage during the fourth test period; and the third control circuit turns off the thirteenth switch and turns on the seventeenth switch, and the fourth control circuit turns off the fifteenth switch and turns on the eighteenth switch in the normal operation period if the third control circuit detects that a voltage at the second terminal of the fourteenth switch is the second voltage during the seventh test period, or the fourth control circuit detects that a voltage at the second terminal of the sixteenth switch is the second voltage during the eighth test period.

23. A method of testing and repairing through silicon via (TSV) in a stacked-chip, the stacked-chip including a first chip, a second chip and a first through silicon via (TSV) structure disposed between the first chip and the second chip in the stacked-chip, the method comprising:
providing a redundant TSV structure between the first chip and the second chip in the stacked-chip;
providing a first testing and repairing apparatus in the first chip comprising:
a first switch and a second switch, wherein first terminals of the first switch and the second switch are coupled to a first terminal of the TSV structure, and a second terminal of the first switch is coupled to a function unit of the first chip;
a first resistor, wherein a first terminal of the first resister is coupled to a first voltage;
a first selector coupled between a second terminal of the second switch and a second terminal of the first resister; and
a first control circuit, detecting the second terminal of the second switch, and controlling the first switch, the second switch and the first selector; and
providing a second testing and repairing apparatus in the second chip comprising:
a third switch and a fourth switch, wherein first terminals of the third switch and the fourth switch are coupled to a second terminal of the TSV structure, and a second terminal of the third switch is coupled to a function unit of the second chip;
a second selector coupled between a second terminal of the fourth switch and a second voltage; and
a second control circuit controlling the third switch, the fourth switch and the second selector; and
coordinately detecting any of an open circuit of the first TSV structure and a short circuit of the first TSV structure to ground by the first testing and repairing apparatus and the second testing and repairing apparatus;
coordinately turning off the redundant TSV structure, by the first testing and repairing apparatus and the second testing and repairing apparatus, when neither of the open circuit of the first TSV structure nor the short circuit of the first TSV structure to the ground is detected; and
coordinately activating the redundant TSV structure to replace the first TSV structure, by the first testing and repairing apparatus and the second testing and repairing apparatus, when any of the open circuit of the first TSV structure and the short circuit of the first TSV structure to the ground is detected.

24. The method of claim 23, wherein each of the first testing and repairing apparatus and the second testing and repairing apparatus has a control unit and a plurality of switches respectively connected to the first TSV structure, a first voltage and a second voltage that is lower than the first voltage, and wherein the coordinately detecting step includes:
controlling on and off of the switches, by the control unit of the first testing and repairing apparatus and the control unit of the second testing and repairing apparatus;
detecting a voltage at one of the first terminal and the second terminal of the first TSV structure by one of the control unit of the first testing and repairing apparatus and the control unit of the second testing and repairing apparatus to determine any of the open circuit of the first TSV structure and the short circuit of the first TSV structure to the ground.

25. The method of claim 24, wherein a path detecting circuit connected to the first testing and repairing apparatus and the second testing and repairing apparatus,
the coordinately detecting step further includes sending a mode selection signal by the path detecting circuit to the control unit of the first testing and repairing apparatus and the control unit of the second testing and repairing apparatus, and
the control step further includes controlling on and off of the switches based on the mode selection signal by the control unit of the first testing and repairing apparatus and the control unit of the second testing and repairing apparatus.

26. The method of claim 25, wherein the path detecting circuit is connected to the second testing and repairing apparatus via a second TSV structure disposed between the first chip and the second chip in the stacked-chip, the method further comprising:
detecting whether a transmission path of the mode selection signal via the second TSV structure is valid; and
when the path detecting circuit determines that the transmission path of the mode selection signal via the second TSV structure is not valid, determining by the path detecting circuit that the stacked-up chip is not self-repairable.

27. The method of claim 23, wherein a path detecting circuit connected to the first testing and repairing apparatus and the second testing and repairing apparatus,
the coordinately detecting step further includes sending a mode selection signal by the path detecting circuit to the first testing and repairing apparatus and the second testing and repairing apparatus, and
the control step further includes controlling on and off of the switches based on the mode selection signal by the first testing and repairing apparatus and the second testing and repairing apparatus.

28. The method of claim 27, wherein the path detecting circuit is connected to the second testing and repairing apparatus via a second TSV structure disposed between the first chip and the second chip in the stacked-chip, the method further comprising:
detecting whether a transmission path of the mode selection signal via the second TSV structure is valid; and
when the path detecting circuit determines that the transmission path of the mode selection signal via the second TSV structure is not valid, determining by the path detecting circuit that the stacked-up chip is not self-repairable.

* * * * *